(12) United States Patent
Jain et al.

(10) Patent No.: US 8,438,437 B2
(45) Date of Patent: May 7, 2013

(54) STRUCTURES AND CONTROL PROCESSES FOR EFFICIENT GENERATION OF DIFFERENT TEST CLOCKING SEQUENCES, CONTROLS AND OTHER TEST SIGNALS IN SCAN DESIGNS WITH MULTIPLE PARTITIONS, AND DEVICES, SYSTEMS AND PROCESSES OF MAKING

(75) Inventors: Arvind Jain, Bengalooru (IN); Prashant Mohan Kulkarni, Bangalore (IN); Srinivas Kumar Vooka, Bangalore (IN); Sundarrajan Subramanian, Bangalore (IN); Rubin Ajit Parekhji, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 381 days.

(21) Appl. No.: 12/938,939

(22) Filed: Nov. 3, 2010

(65) Prior Publication Data

US 2012/0030532 A1 Feb. 2, 2012

(30) Foreign Application Priority Data

Jul. 27, 2010 (IN) .......................... 2329/CHE/2010

(51) Int. Cl.
*G06F 11/00* (2006.01)

(52) U.S. Cl.
USPC ......................................... 714/726; 714/731

(58) Field of Classification Search ................... 714/726, 714/725, 727, 728, 729, 730, 731, 738
See application file for complete search history.

(56) References Cited

U.S. PATENT DOCUMENTS

| | | | |
|---|---|---|---|
| 6,615,380 B1 * | 9/2003 | Kapur et al. ................ | 714/738 |
| 7,555,687 B2 | 6/2009 | Varadarajan et al. | |
| 7,657,790 B2 | 2/2010 | Whetsel | |
| 7,937,634 B2 * | 5/2011 | Almukhaizim et al. ....... | 714/726 |
| 2005/0055615 A1 | 3/2005 | Agashe et al. | |
| 2005/0060625 A1 | 3/2005 | Wang et al. | |
| 2007/0101221 A1 | 5/2007 | Fredrickson et al. | |
| 2007/0168767 A1 * | 7/2007 | Jaber et al. ..................... | 714/700 |
| 2007/0168797 A1 | 7/2007 | Fredrickson et al. | |
| 2008/0307240 A1 | 12/2008 | Dahan et al. | |
| 2009/0204831 A1 | 8/2009 | Cousson et al. | |
| 2009/0217000 A1 | 8/2009 | Magee et al. | |
| 2009/0228749 A1 | 9/2009 | Rajski et al. | |
| 2010/0107024 A1 | 4/2010 | Tokunaga | |
| 2011/0099442 A1 | 4/2011 | Hales et al. | |

OTHER PUBLICATIONS

A. Sehgal, J. Rearick, J. Fitzgerald, "Test cost reduction for the AMD™ Athlon processor using test partitioning", Intl. Test Conf., 2007, paper 1.3, 10pp. Figs. 1, 2, 4-6.

OTHER PUBLICATIONS

K. Agarwal et al. "Power Analysis and Reduction Techniques for Transition Fault Testing", Asian Test Symp., 2008, pp. 403-408. Figs. 7-9, 12-13, 16.

* cited by examiner

*Primary Examiner* — Dieu-Minh Le
(74) *Attorney, Agent, or Firm* — Wade J. Brady, III; Frederick J. Telecky, Jr.

(57) ABSTRACT

A scannable integrated circuit (100) including a functional integrated circuit (P1, P2) having scan chains, multiple scan decompressors (120.1, 120.2), each operable to supply scan bits to some of the scan chains (101.k, 102.k), a shared scan-programmable control circuit (110, 300), a tree circuit (400) coupled with the functional integrated circuit (P1, P2), the shared scan-programmable control circuit (110, 300) coupled to control the tree circuit (400), and a selective coupling circuit (180) operable to provide selective coupling with the shared scan-programmable control circuit (110, 300) for scan programming through any of the multiple scan decompressors (120.1, 120.2). Other circuits, devices, systems, and processes of operation and manufacture are disclosed.

46 Claims, 11 Drawing Sheets

STRUCTURES AND CONTROL PROCESSES FOR EFFICIENT GENERATION OF DIFFERENT TEST CLOCKING SEQUENCES, CONTROLS AND OTHER TEST SIGNALS IN SCAN DESIGNS WITH MULTIPLE PARTITIONS, AND DEVICES, SYSTEMS AND PROCESSES OF MAKING

CROSS-REFERENCES TO RELATED APPLICATIONS

This application is related to India Patent Application 2329/CHE/2010 (TI-69244IndiaPS) "Structures and Control Processes for Efficient Generation of Different Test Clocking Sequences, Controls and Other Test Signals in Scan Designs with Multiple Partitions" filed Jul. 27, 2010, for which priority is claimed under the Paris Convention and 35 U.S.C. 119 and all other applicable law, and which is incorporated herein by reference in its entirety.

This application is related to U.S. patent application Ser. No. 12/604,397 (TI-65831), "Enhanced Control in Scan Tests of Integrated Circuits with Partitioned Scan Chains" filed Nov. 9, 2009, and which is incorporated herein by reference in its entirety.

This application is related to U.S. Patent Application Publication 20050055615 (TI-36268) "At-speed ATPG testing and apparatus for SoC designs having multiple clock domain using a VLCT test platform" dated Mar. 10, 2005, and which is incorporated herein by reference in its entirety.

This application is related to U.S. Patent Application Publication 20080307240 (TI-60478) "Power Management Electronic Circuits, Systems, and Methods and Processes of Manufacture" dated Dec. 11, 2008, and which is incorporated herein by reference in its entirety.

This application is related to U.S. patent application Ser. No. 12/904,303 (TI-68166) "Compressed Scan Chain Diagnosis by Internal Chain Observation Processes, Circuits, Devices and Systems" filed Oct. 14, 2010, and which is incorporated herein by reference in its entirety.

This application is related to U.S. Provisional Patent Application 61/055,252 (TI-66396PS) "Transition Fault Test (TFT) Power Reduction Using Clock Gate Controls" filed May 22, 2008, and which is incorporated herein by reference in its entirety.

FIELD OF THE INVENTION

The field of the invention includes design-for-test circuits in integrated circuits, and processes of testing integrated circuits.

BACKGROUND

In the integrated circuit field, scan testing involves introducing sequences of ones and zeros, called scan bits, into the integrated circuits for testing them. Scan compression is a way of reducing the volume of such bits sent from the tester to an integrated circuit.

Scan compression is mainstream technology today. A Glossary is provided in TABLE 1.

Scan compression architectures have components called a Compactor, STUMPs, and Decompressor. A Decompressor decompresses input channel data into internal scan-ins to multiple internal scan chains called STUMPs. (A respective scan channel pertains to any given set of scan chains among a number of such sets that make up all the scan chains in the integrated circuit.) There are different decompressor architectures available in the industry, e.g. XOR decompressor, mux/demux decompressor, LFSR (Linear Feedback Shift Register) based decompressor. A Compactor, also called a Compressor, compresses internal scan-outs data into output channels. Different compressor architectures are available in the industry for e.g. XOR compressor, and MISR (Multiple Input Signature Register) based compressor. Control logic programmation can be done through ATPG, such as when control logic is getting input data from decompressor or from top level input channels, or through an external interface like a JTAG 1149 scan interface or an IEEE 1500 scan interface.

Scan compression techniques are widely used to contain the test application time and test data volume. Scan partitioning of a device under test (DUT) is used to contain test mode power dissipation.

With a large number of clock domains, ATPG is simplified if clock pulse generation logic is also merged into the DUT scan chains. An ATPG tool controls generation of clock pulses on a per pattern basis. Each such scan chain is referred to herein as a clock-control chain, clock register chain or clock chain. A clock shaper module with a finite state machine FSM control and clock-control chain is amenable to such ATPG. For large designs, an additional concern is the power dissipated during the scan test mode of operation. DUT partitioning is often desirable for ease of implementing sub-chips and integrating them into an SOC (system-on-chip). Besides, it also allows for coarse grain test mode power control, since different series and parallel operations on different partitions can be controlled through various test modes.

For a SoC with a large number of clock domains, the logic contained in different clock domains is often selectively targeted for fault excitation and fault propagation in each pattern generated by the ATPG tool. In this way, faults in logic in specific clock domains are detected by different sets of patterns. Two reasons for problems with this mode of operation are:

While the logic within a clock domain is timed to perform at the rated speed of the clock, the logic across clock domains is often not, since it is considered asynchronous, and is hence often timed for slow multi-cycle operation. This makes the ATPG tool generated pattern set targeting such logic ineffective if there are multiple different clocks controlling the logic inside and across the domains. This is because (i) if the pattern is applied at rated speed, the inter-clock domain logic will not operate correctly, and (ii) if the pattern is applied at lower speed, the intra-clock domain logic is under-tested. In either case, the clocks to the different domains cannot be applied together, and must therefore be applied selectively, depending upon which portion of the logic is being targeted for coverage in a particular pattern.

Often the different domains are segregated for reasons of (i) modular design, (e.g. an SOC with multiple IPs integrated therein, wherein each IP is treated as a different partition) or (ii) test mode power control, (e.g. an SOC is divided up into different partitions, wherein only one or few partitions are targeted in a given phase (run) of ATPG, and the entire SOC is hence covered in ATPG through multiple such phases).

In both the above cases, different sets of ATPG patterns use different clocks. The ATPG pattern generation process is, therefore, coupled with a clock control process. Note that an ATPG pattern consists of a Shift phase wherein all flop-flops in the active scan chains are shifted together and a Capture phase wherein the response of the circuit to the initialized values in the flip-flops (in the immediately preceding Shift phase) is captured. For stuck-at fault ATPG patterns, a single Capture clock is adequate since the timing is not critical and slow clock application is adequate. However, for transition fault ATPG patterns, two Capture clocks are applied with the interval between them corresponding to the time period between successive clocks in the functional (normal) mode of operation. Transition fault ATPG patterns are thus used to test the logic at its rated speed of operation. Two ways of providing for this coupling are: (i) The clock control is set statically before the start of each phase of ATPG. In this case, different ATPG runs are involved to target logic within different clock domains, as well as across them. (ii) The clock control is set dynamically for each pattern by making the register which controls the generation of the capture clocks part of the scan chains of the logic under test. In this case, a single ATPG run targets all intra-domain and inter-domain logic.

The clock control mechanism in (ii) above becomes complex when the SOC is divided into different partitions for reasons of modular design or for test mode power containment. This is because the clock control register may be residing in one partition while a given ATPG run is being targeted to generate patterns to cover the logic in another partition. Some ways of addressing this problem are needed.

Another problem in a SOC with multiple partitions and scan design is that it is easier to control the clock register in each partition. In that case, the clock register must be replicated in each partition together with the clock controller, i.e. the entire clock shaper module must be replicated, so a separate clock shaper is used for each partition. The selected shaper provides selective capture of clock pulses, as controlled during ATPG, for transition fault patterns.

This approach has some important drawbacks:
(a) Logic overhead due to replication of the clock shaper logic in every partition.
(b) Even if the same functional clock were used for different partitions, the clock tree must be regenerated inside each one of them. In other words use of functional clock across multiple partitions leads to multiple clock trees being generated.
(c) Since the clock shapers and generated clocks are independent across the partitions, synchronous paths between the logic residing across clock domains cannot be tested or cannot be tested at-speed, since the clock outputs from independent clock shapers cannot be synchronized.
(d) Common clock control required across different partitions being tested together results in more inefficient ATPG since more care-bits are now required to fill up the clock control register in the scan chains within each partition. Inability to provide the required number of care-bits further results in two or more separate pattern sets.

The alternate approach is to keep a clock control register outside any DUT scan chain. This register would be programmed once at the beginning of each phase of ATPG. The disadvantages are two-fold. (i) It is cumbersome to perform ATPG in an SOC with multiple clock domains, since apart from multiple ATPG runs, (each of which requires the clock register to be programmed separately—the number of such runs can be intractably large for SOCs with 100+ clock domains), it is now also difficult to ensure that all possible capture clock sequences have been enumerated before the ATPG phases are finalized. (ii) Process-wise, the tool can perform ATPG more efficiently if the option of selecting a particular clock sequence for a particular pattern set is left to the tool, as against the sequence being fixed, (which is the case when a particular pattern set is being generated in a particular phase of ATPG).

Solutions to any of these and other problems are desired and needed in this art.

SUMMARY OF THE INVENTION

Generally, and in one form of the invention, a scannable integrated circuit includes a functional integrated circuit having scan chains, multiple scan decompressors, each operable to supply scan bits to some of the scan chains, a shared scan-programmable control circuit, a tree circuit coupled with the functional integrated circuit, the shared scan-programmable control circuit coupled to control the tree circuit, and a selective coupling circuit operable to provide selective coupling with the shared scan-programmable control circuit for scan programming through any of the multiple scan decompressors.

Generally, a process form of the invention is a process for utilizing a plurality of test patterns in an integrated circuit having multiple partitions and scan chains therein. The process includes decompressing such test patterns to provide decompressed test patterns, partition-specifically supplying bits to a plurality of the partitions via scan-in of the scan chains therein using parts of the decompressed test patterns, and routing in at least another part of the decompressed test patterns as programming bits to a shared control circuit, regardless of which test pattern in the plurality, to control a tree circuit that is coupled to the plurality of the partitions.

Generally, a process of manufacturing form of the invention involves a process of manufacturing an integrated circuit including using fabrication equipment to make an integrated circuit having functional circuitry with scan chains, multiple scan decompressors each operable to supply scan bits to some of the scan chains, a shared scan-programmable control circuit, a tree circuit coupled with the functional circuitry, the control circuit coupled to control the tree circuit, and a selective coupling circuit operable to provide coupling of the shared scan-programmable control circuit for scan programming through any selected one of the multiple scan decompressors.

Generally, a telecommunications device in another form of the invention includes a printed circuit board, a first integrated circuit having functional circuitry with scan chains, multiple scan decompressors each operable to supply scan bits to some of the scan chains, a shared scan-programmable control circuit, a tree circuit coupled with the functional circuitry, the control circuit coupled to control the tree circuit, and a selective coupling circuit operable to provide coupling of the shared scan-programmable control circuit for scan programming through any selected one of the multiple scan decompressors, and a modem integrated circuit electrically coupled with the first integrated circuit and to the printed circuit board.

Other circuits, devices, systems, and processes of operation and manufacture are disclosed and claimed.

Figure 1:
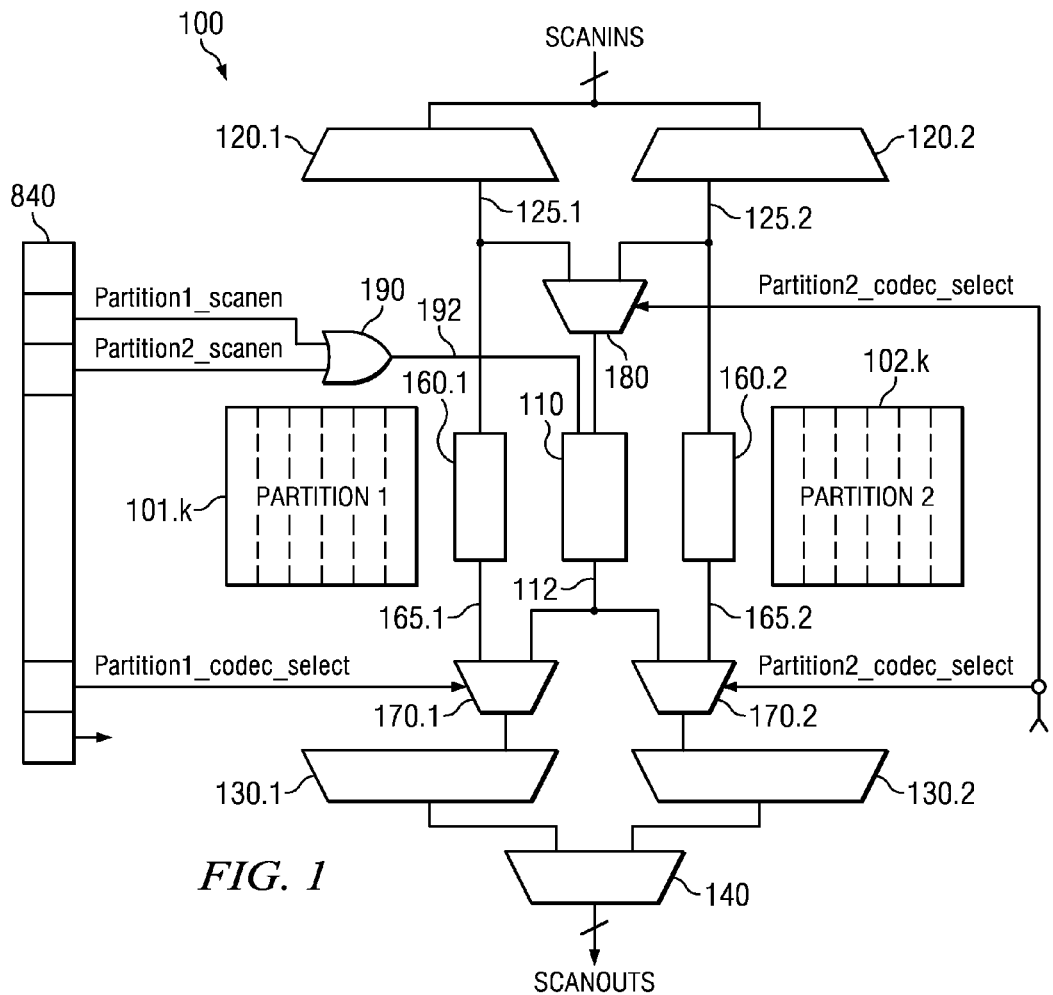
FIG. 1 is a block diagram of an inventive scan chain circuit performing respective operations.

Corresponding numerals in different Figures indicate corresponding parts except where the context indicates otherwise. A minor variation in capitalization or punctuation for the same thing does not necessarily indicate a different thing. A suffix .i or .j or .k refers to any of several numerically suffixed elements having the same prefix.

DETAILED DESCRIPTION OF EMBODIMENTS

The inventive embodiments described herein below address and solve one or more of the above-mentioned problems discussed in the Background, as well as other problems. Some embodiments control issue of clocks in scan-based designs with multiple partitions. For some introduction, see e.g. U.S. Patent Application Publication 20050055615 (TI-36268) incorporated herein by reference "At-speed ATPG testing and apparatus for SoC designs having multiple clock domain using a VLCT test platform" and FIGS. 1A and 2 therein, and U.S. patent application Ser. No. 12/604,397 (TI-65831), incorporated herein by reference, "Enhanced Control in Scan Tests of Integrated Circuits with Partitioned Scan Chains" and FIGS. 2 and 9 therein.

Remarkable embodiments are described herein for circuits and ATPG, and provide, use and re-use a single or shared programmable clock shaper/control module (FIG. 3) and shared clock-control chain (FIG. 4) across multiple partitions. The ATPG tool (FIG. 5) is provided with an option of controlling these clocks on a per pattern basis, thereby enabling efficient ATPG (single ATPG run to target logic in multiple clock domains) as well as good test quality (both inter-clock domain IL (FIG. 2) and intra-clock domain logic in P1 and P2 are covered).

Transition fault ATPG clocking is facilitated for a DUT/partition with two or more clock domains, ATPG is simplified by doing the clock control selection on a per pattern basis. One way of accomplishing this includes the clock pulse generation control register 110 of FIG. 1 as part of the DUT scan chains and has the ATPG tool provide the care bits (under user specified constraints) to generate the right sequence of pulses, e.g., defining clock control scan bits for register 110. Such control facilitates the generation of transition fault patterns for different clock domains in a single ATPG run using dynamic selection of applicable clocks (including applicable points in clock tree applied or not applied) and their frequencies on per pattern basis. With multiple CoDecs, for each phase of ATPG, this register is included in the test circuitry supporting the partition which is currently driven by the applicable CoDec. In case of a single such register 110 for the entire DUT, this register 110 is placed selectively into the active partition such as by muxing or demuxing.

Desirably, the scan programming for the shared clock shaper/control module is made compatible with test patterns and tester operations off-chip to time-efficiently communicate with multiple compactor/decompressor (CoDec) hardware and the shared circuitry, both of which confer real-estate-efficiency and test efficacy on-chip. Decompressor scan feeds programming to the shared control module along with decompressor scan-initialization to each of the partitions. The respective partitions can be scan-initialized one-by-one in phases in response to respective input test patterns. The respective test patterns are concurrently decompressed into respective programming for the shared control module as well, and that programming can thus flexibly be made to change from pattern to pattern, i.e. from phase to phase. The shared control module and shared clock-control tree (or other control tree) can be variously operated or not operated across multiple partitions after one or more of the partition-specific initialization phases, dramatically, advantageously, and beneficially increasing test flexibility and test coverage in precisely the problem scenarios pointed out earlier hereinabove or elsewhere herein.

At-speed tests are a valuable part of test patterns due to the short chip-design cycles and technology shrinking LOC (Launch-off-Capture), LOS (Launch-off-Shift), path-delay, small delay defects (concentrates on most critical delay paths), and dynamic bridging are a few of the at-speed tests for SoCs. For background on some of these known tests, see U.S. patent application Ser. No. 12/604,397 (TI-65831), incorporated herein by reference, "Enhanced Control in Scan Tests of Integrated Circuits with Partitioned Scan Chains" and R. Parekhji, "Embedded cores and system-on-chip testing", (Chapter 7) in *Advances in Electronic Testing: Challenges and Methodologies*, edited by D. Gizopoulos, *Springer*, 2006, pp. 217-262.

One or more on-chip PLLs (phase lock loops) and pulse generator circuits generate at-speed pulses for testing, controlled by a programmable FSM(s) (finite state machine) for adjusting the delays of the launch-capture pulses and the spacing between them. Complexity of the pulse generator FSM increases many-fold with increasing number of clock domains in the design; and so, avoiding replicating it saves chip real estate.

Figure 2:
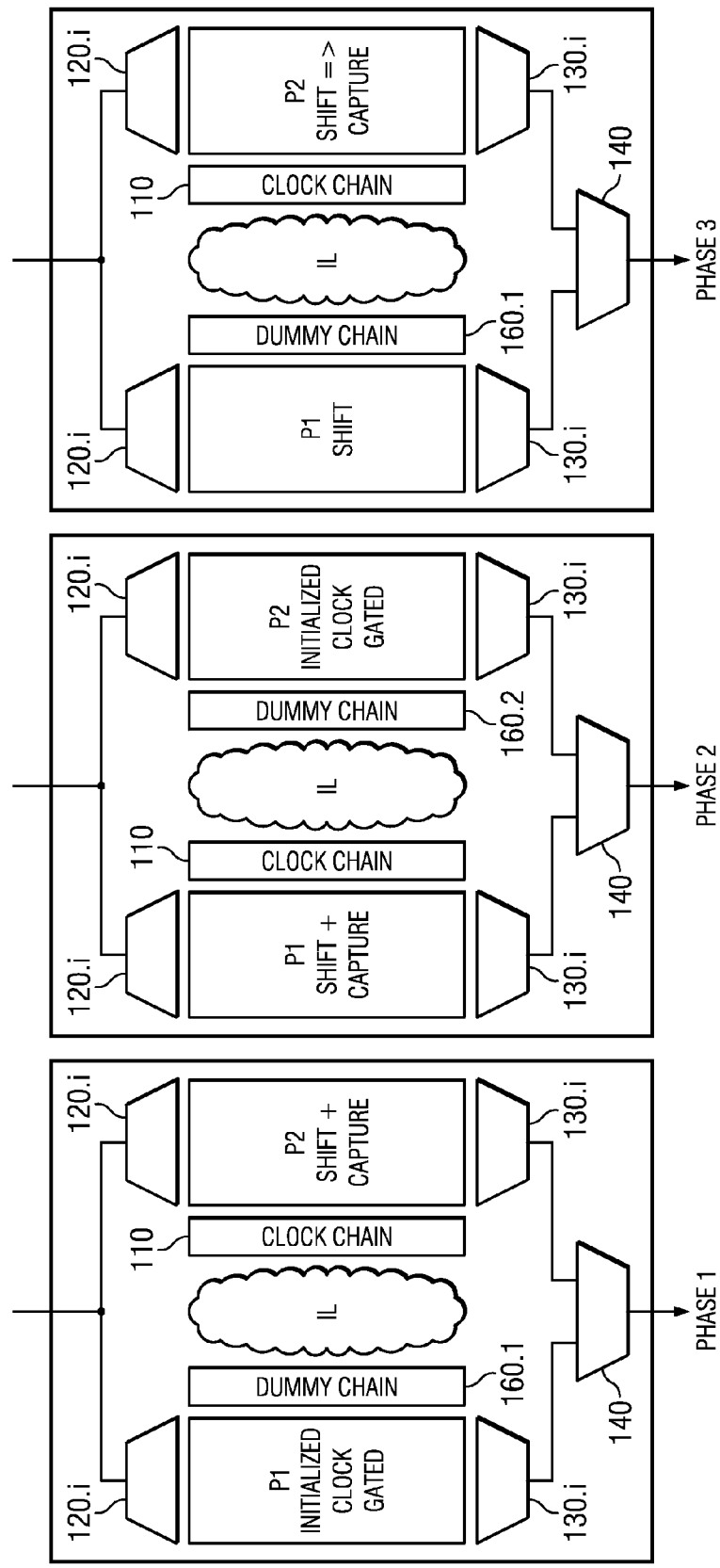
FIG. 2 is a simplified block diagram of the inventive scan chain circuit of FIG. 1 performing respective operations.

In FIGS. 1-2, a clock chain control circuit embodiment 100 includes two partitions Partition) and 2 (or P1 and P2) having respective sets of scan chains 101.k, 102.k, and coupled with one or more individual scan compression CoDecs such as CoDecs 120.1, 130.1 and 120.2, 130.2. In some embodiments, decompressors 120.i and compactors 130.i are implemented using combinatorial elements. However, in other embodiments, the decompressors 120.1, 120.2 etc. and compactors 130.1, 130.2 etc. can be implemented using sequential (clocked) elements, or a combination of combinatorial and sequential elements. Use of an optimized number of CoDecs 120.i, 130.i provides circuit economy, while considering pattern generation, by routing a few scan input lines and scan output lines to multiple CoDecs instead of routing many scan lines carrying decompressed scan data some distance on the chip to a single shared CoDec (or other fewer number of them). Provision and use of partitions recognizes existent functional cores or sub-chips of an integrated circuit, or in effect partitions the integrated circuit in some other way that is scan-test relevant such as by domains for clocking and/or voltage, so that the partitions can be usefully controlled independently or in coordination sequentially or concurrently through various test modes. Also, partitioning can permit test mode power control and lower power dissipation under test. (Some conventional methods can incur test power that is much more than the functional power dissipated by a chip.) Various embodiments herein also help reduce or obviate possible impact of partitioning on test circuit real estate and loss of coverage in logic across partitions. FIGS. 1-2 are described further after FIG. 3 next.

Figure 3:
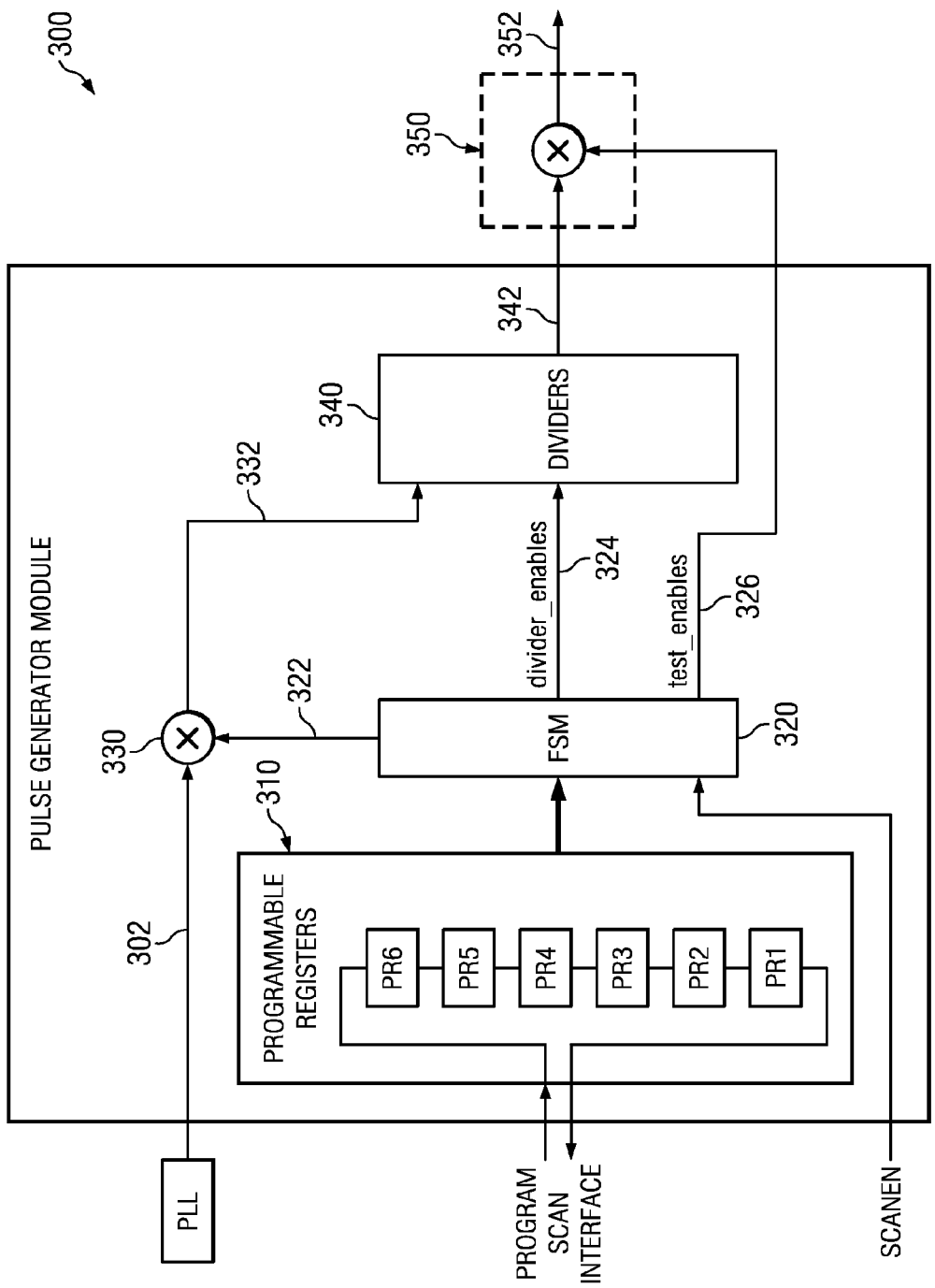
FIG. 3 is a block diagram of a clock control circuit with clock chain programming registers, a clock control finite state machine (FSM), and how connected to other circuits that the clock chain registers control.

In FIG. 3, pulse generator module circuitry 300 is shown for at-speed test clock generation. The pulse generator module 300 includes a set of programmable registers 310. Among registers 310, a programmable register PR1 identifies, decides or determines the launching clock domain, and a programmable register PR2 identifies, decides or determines which clock domain is the capturing clock domain for purposes of the test. A finite state machine FSM 320 responds to the programmable registers 310 and thus programmably executes a sequence and outputs controls 322 for gating clock, controls 324 for clock divider enables, and controls 326 for test enables. The controls 322, 324, 326 respectively control a clock gate circuit 330, a clock dividers circuit 340, and a clock shaping circuit 350 that together do the at-speed test clock generation. The registers PR3 and PR4 program, decide or determine the width of the test enable signals of controls 326 used for shaping, and the registers PR5 and PR6 program, decide or determine the delay and spacing of launch and capture pulses respectively. At-speed clocks on a line 305 are generated from a free running PLL clock and gated by the clock gate circuit 330 and fed by a line 332 to the clock dividers circuit 340, and thereby provide a burst of at-speed clock (e.g., a programmable number such as 10 pulses of at-speed clock) on the line 332. Circuit 340 divides the burst-gated clock from circuit 330 as directed by controls 324 and provides the resulting divided burst clock on a line 342 to clock shaping circuit 350. FSM 326 provides test enables 326 that are generated by the pulse generator 300 for clock shaping circuit 350. Clock shaping circuit 350 can be situated inside a functional module of the integrated circuit or in pulse generator module 300 itself. Thus, shaping can be done by the inside the functional module or in pulse generator module 300 itself. In different embodiments, this generation can be done at a single module centrally or at multiple modules locally, resulting in many possible clock tapping points which are verified for a given clock domain. All the programmable registers 310 are part of a scan chain (see scan chain 110 of FIG. 1 and FIG. 2) and that chain is referred as a clock-control chain, clock register chain or clock chain.

In FIG. 1, an integrated circuit 100 has partitions or portions Partition 1, 2, etc. that can be operated in a functional mode for use or in a test mode (also called ATPG mode here) controlled and mediated by the FIG. 1 scan circuits for test. Cores for partitions herein are shown also, for example, in FIG. 6 herein, which replicates FIG. 6 of U.S. Patent Application Publication 20080307240 "Power Management Electronic Circuits, Systems, and Methods and Processes of Manufacture" dated Dec. 11, 2008, and which is incorporated herein by reference in its entirety. Note that operations in 'functional' mode or operation can include transitions to sleep and wake up, and power management controlled voltage and clock frequency adjustments as shown in FIGS. 20-31 of that U.S. Patent Application Publication 20080307240, as well as free-running operation of peripherals and execution of operating system and software applications in an awake state of the integrated circuit SoC.

In functional operating of a partition or portion of the integrated circuit, such a clock shaper 350 as in FIG. 3 is disabled and lets the functional clocks pass clock gate circuit 330 and be established by clock dividers circuit 340 or separate functional clock dividers downstream (not shown) without any modification and undisturbed by test circuitry herein so that Capture clock goes directly to clock shaper output 352. Also, this disabled state is used during ATPG mode when it is desired that the clock shaper 350 not be used. In ATPG mode with clock shaper 350 enabled, Shift clock and Capture clock are utilized. During Shift, clock shaper 350 sends Shift clock to all functional clock lines as clock shaper output 352. A DFT Scan Enable and DFT Shift clock are connected to a Scanen input for a given partition in FIG. 1. During capture, DFT Scan Enable starts the clock shaper FSM 320. The Capture clock is used as free-running at-speed reference clock gated by the clock shaper logic to test the selected integrated circuits at-speed. Under state machine FSM control, at-speed clock can be turned on for a circuit under test for the duration of each of one or more control pulses and then turned off, or a programmable number of at-speed clock pulses can be issued whereupon they are terminated. Non-contiguous selected ones of a series of at-speed clock pulses can be issued, and multiple clock lines can be activated in any such programmably controllable ways with controllable sequences of pulses offset in time from one another.

A clock shaper 300, for example, can have a clock manager, clock shaping logic 350, a shift register, and a reset generator interconnected with one another. As one example, the clock shaper 300 is treated as a controllable block as shown in FIG. 3 for the programming or control circuitry of FIGS. 1-2 herein. For example, clock shaper control registers 310 can be loaded to define Launch Enables and their widths for Launch, Capture Enables and their widths for Capture, and to set delays before pulsing the enables for each of Launch and Capture.

TABLE 1

GLOSSARY

| | |
|---|---|
| ATPG: | Automatic Test Pattern Generation. Using vendor tools to generate patterns to check the quality of silicon during production. Generally refers to the stuck-at fault test pattern generation. Also can refer to $I_{DDQ}$ (static current into chip) and delay test pattern generation. |
| BIST: | Built-In Self Test. Internal controller logic designed to apply stimulus to test a block of logic without applying test vectors (software). May refer to Memory BIST. |
| Bypass Pattern: | Access from tester to internal scan chains inside DUT without CoDec logic, i.e. a pattern generated when CoDec is bypassed. |
| CDR/PI/scan-ff: | Core Data Register/Primary Input/scan-flip-flop. Some embodiments replace with programmable register for test mode control. |
| CoDec: | Compressor (Compactor) and Decompressor. |
| Compiled tdl: | TDL compiled in tester language. |

TABLE 1-continued

GLOSSARY

| | |
|---|---|
| DFT: | Design for Test. |
| DUT: | Design Under Test |
| I/O: | I = Input, O = Output. |
| IP core: | Intellectual Property core (internal details not necessarily known to tester) |
| IR/DR: | Instruction Register/Data Register. |
| JTAG: | Joint Test Action Group, more commonly referring to the IEEE 1149.1 Standard, which defines the Test Access Port (TAP) and boundary scan design at the chip level. |
| Partition: | A portion of an integrated circuit such as variously a clock domain or a voltage domain, or hardware portion having scan chains that share a decompressor or compressor; or a functional integrated circuit IP core such as in a more extensive SoC,. |
| Scan: | Structural test methodology that places the chip in a special scan state where virtually all functional flops are connected into one or more shift registers accessible to the tester, permitting test stimuli to be applied, and responses to be recovered. |
| Setup/Header content: | Control bits to configure the TAP controller (not the bits for the scan chain) |
| SI/SO: | Scan In/Scan Out |
| SOC: | System on Chip |
| Spf: | STIL protocol file. |
| STA: | Static Timing Analysis |
| STIL: | Standard Test Interface Language (standard language for test patterns |
| STIL/TDL patterns: | Standard Test Interface Language/Test description language patterns. |
| STUMPS: | Self-Test internal smaller scan chains for scan-ins/scan-outs |
| TAP: | Test Access Port. Defines I/O and state machine for test mode access. |
| TDL: | Test description language (TI specific language for test patterns) |
| TFT: | Transition Fault Test: Generating patterns that can detect slow-to-rise and slow-to-fall faults in addition to stuck-at-1 and stuck-at-0 faults. Application of patterns at the functional speed of the circuit. |
| 1500: | IEEE1500 standard for core based testing, P1500, similar to JTAG 1149. |

The disclosed embodiments of FIGS. 1-2 and other embodiments work for any number of partitions as well as for scan operation with scan compression CoDec (Compactor-Decompressor) structures inserted into one or more partitions individually or at the SOC top level. The ATPG tool programs or fills the clock register 110 according to the user specified constraints. The constraints are honored in the form of care-bits which are satisfied in the ATPG pattern set. The solution of FIGS. 1-2 is applicable to a clock shaper module 300 of FIG. 3. The module 300 has an FSM controller 320 and clock control register 310 (called register 310 in brief subsequently herein) that issue a specific number of clock pulses in different clock domains, either together or one after the other, with user specified control for spacing between them and across them, for transition fault ATPG. The controller 320 is not put on scan during transition fault ATPG, since it is responsible for the desired generation of clock pulses during the capture phase. The clock control register 310 is, however, put on scan, (may be on multiple internal STUMPS channels—scan chains—depending upon the number of flip-flops in this register(s)). This register scan chain 110 of FIG. 1 is loaded on a per pattern basis (as part of the scan shift operation) so that the right number of pulses are generated in the capture phase immediately following the shift operation.

Further to solve the problems described in the Background and other problems, various embodiments of process and structure control such clock register chains 110.i inside different partitions. The remarkable clock control mechanism 100 in FIG. 1 eliminates need for multiple clock controllers in multi-partitioned designs. This reduces the need for multiple clock shapers and also the number of ATPG runs. In an extreme case, from N clock shapers (one for each of the N partitions in an SOC), and up to N! (N-factorial) ATPG runs for these N partitions, a single ATPG run with a single clock shaper 300 across N partitions is now sufficient. The same clock shaper module 300 is shared across all the partitions Partition), 2, . . . and can also be controlled independently in FIG. 1.

In FIG. 1, a clock chain control circuit embodiment 100 includes two partitions Partition 1 and 2 with their individual scan compression CoDecs 120.1 and 120.2. Each of two Decompressors 120.1 and 120.2 is shown as a demux trapezoid fed by an input line designated Scanins. Each Decompressor 120.i supplies scan bits to scan chains organized as STUMPS channels in its respective Partition 1 or 2 (details de-emphasized for clarity). The STUMPs for each respective Partition 1 or 2 are fed to a Compactor 130.1 or 130.2 corresponding to that Partition 1 or 2. Each of the two Compactors 130.1 and 130.2 is shown as a mux trapezoid fed to a scanout mux 140 that in turn supplies scan out data to an output designated Scanouts. Further in FIG. 1, a Dummy scan chain 160.1 or 160.2 (open rectangle) for each partition 1 or 2 is fed by a respective Decompressor 120.i output line 125.i, and Dummy chain output 165.i in turn goes to a first input of a respective one of two output Muxes 170.1 or 170.2 that in turn feeds an input of a respective Compactor 130.1 or 130.2. A single clock chain 110 (filled rectangle, also called clock control register scan chain 110) is fed by an input Mux 180 that itself has a first input and a second input from the respective Decompressor output lines 125.1 and 125.2 that feed the Dummy chains 160.1 and 160.2. The single clock chain 110 has an output 112 connected to a second input of both of the two output Muxes 170.1 and 170.2 that go to the Compactors 130.1 and 130.2. In this way, one or both of mux circuit 180 and mux circuits 170.i are arranged and operable to provide a scan path via each dummy chain 160.i between its decompressor 120.i and the corresponding scan compactor 130.i unless the shared scan-path 110 (310) is currently-selected to provide such scan path therebetween.

Figure 1A:
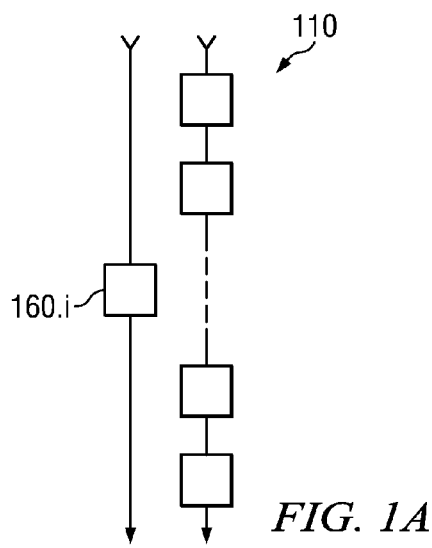
FIG. 1A is a block diagram comparatively detailing a clock chain and one of the dummy chains for use in FIGS. 1 and 2.

In FIG. 1A, dummy chain 160.i is a reduced form of a scan chain with a single flip-flop, or much-reduced number of flip-flops, compared to scannable clock chain 110. Scannable clock chain 110 is a set of serially-connected flip-flops driven by a decompressor 120.i and terminates into the compactor 130.i. The ATPG tool may be set up to have a scan integrity check for a fixed number of scan chains in every partition. In FIG. 1, since the clock chain 110 is shared, the active partition i would have one more chain than the fixed number of the integrity check; or alternately, the inactive partitions would have one less chain than the fixed number of the integrity check. The dummy chain 160.i fills this gap and obviates this discrepancy, and allows the circuit 100 to satisfy the integrity check and the ATPG tool to proceed. Effectively, the dummy chain 160.i just consists of, e.g., one flip-flop having its data D input driven by the Decompressor output 125.i and its flip-flop Q output going into the Compactor 130.1 via mux 170.1. In FIG. 1, the clock chain 110 is muxed by muxes 180 and 170.i into the active partition i, and dummy chain 160.j is in the inactive partition (compare FIGS. 1 and 2) and indeed each inactive partion to which the clock chain 110 is not muxed. These chains 110 and 160 are switched into and out of the partition selectively, depending upon which partition i is active and which partitions j are not active.

Given that N partitions are scanned, the combination of N dummy chains 160 plus a single clock chain 110 (for a total of N+1 circuits) is preferable to N clock chains because the clock chain 110 has many flip-flops and the dummy chains 160 have as few as one flip-flop per dummy chain 160.i. Having a clock shaper 300 control a scan chain one-shaper-per-partition not only implies higher area (for the chain) but also more effort for the ATPG tool, since more than one chain must be controlled (in many cases identically—further increasing the effort). In an extreme case, each such chain may also end up with a dedicated clock shaper plus controller logic further aggravating the overhead. A clock shaper can have a large number of flip-flops, e.g., 100-300 flip-flops more or less. On the other hand, having just one such scan chain 110 and N dummy scan chains 160 (which effectively involves only one flip-flop per dummy chain), is a far more efficient solution both from a chip real-estate area perspective and ATPG efficiency viewpoint.

Also, in some alternative embodiments (not shown) and depending on the details of the integrity check, additional dummy chain demuxes 185.i couple the decompressors 120.i with only a single dummy chain 160 in a way mirror imaged to muxes 165.i coupling the compactors 130.i with the single clock chain 110 so that the integrity check always detects the expected number of scan chains at each CoDec it checks.

Still another alternative embodiment omits the dummy chains 160.i entirely from FIG. 1 and revises the tester integrity check process to recognize different expected numbers of scan chains. Muxes 165.i are replaced with a single output demux 165 providing a 1:N demux selectively from clock chain 110 output 112 to one input of each of the N compactors 130.i. Looking at FIG. 1 itself from such perspective, the FIG. 1 muxes 165.i collectively act as and include such a 1:N demux for clock chain output 112 while compositely providing couplings for all dummy chains 160.j to their respective compactors 130.j other than the compactor 130.i to which clock chain output 112 currently goes. See further discussion for FIGS. 11-12 later hereinbelow.

A selection control line Partition1_codec_select in FIG. 1 goes to the selector for first output Mux 170.1 for Dummy chain 160.1 and Clock chain 110 if and when associated with Partition 1. Another selection control line Partition2_codec_select goes to the selector for second output Mux 170.2 for Dummy chain 160.2 and Clock chain 110 if and when associated with Partition 2. Partition2_codec_select also goes to the selector for the hereinabove-described input Mux 180 fed from the Decompressors 120.1 and 120.2.

A pair of scan-enable controls Partition1_scanen and Partition2_scanen go to inputs of an OR-gate 190. The OR-gate 190 output goes to the clock chain 110 on a line 192 that provides a FIG. 3 clock-shaper scan enable Scanen connection to the clock chain 110. Given two partitions in FIG. 1, Partition1_scanen can be the logical complement of Partition2_scanen, where an active logic state of Partitioni_codec_select for the mux 170 and 180 selectors indicates selection for output from, and input to, clock chain 110 by such mux for which the selector is active. Given more than two partitions, some embodiments suitably provide a coded (shorter) form of codec_select signal that is decoded at each mux to select output from, and input to, clock chain 110 by each such mux to support the currently-applicable partition.

Figure 8:
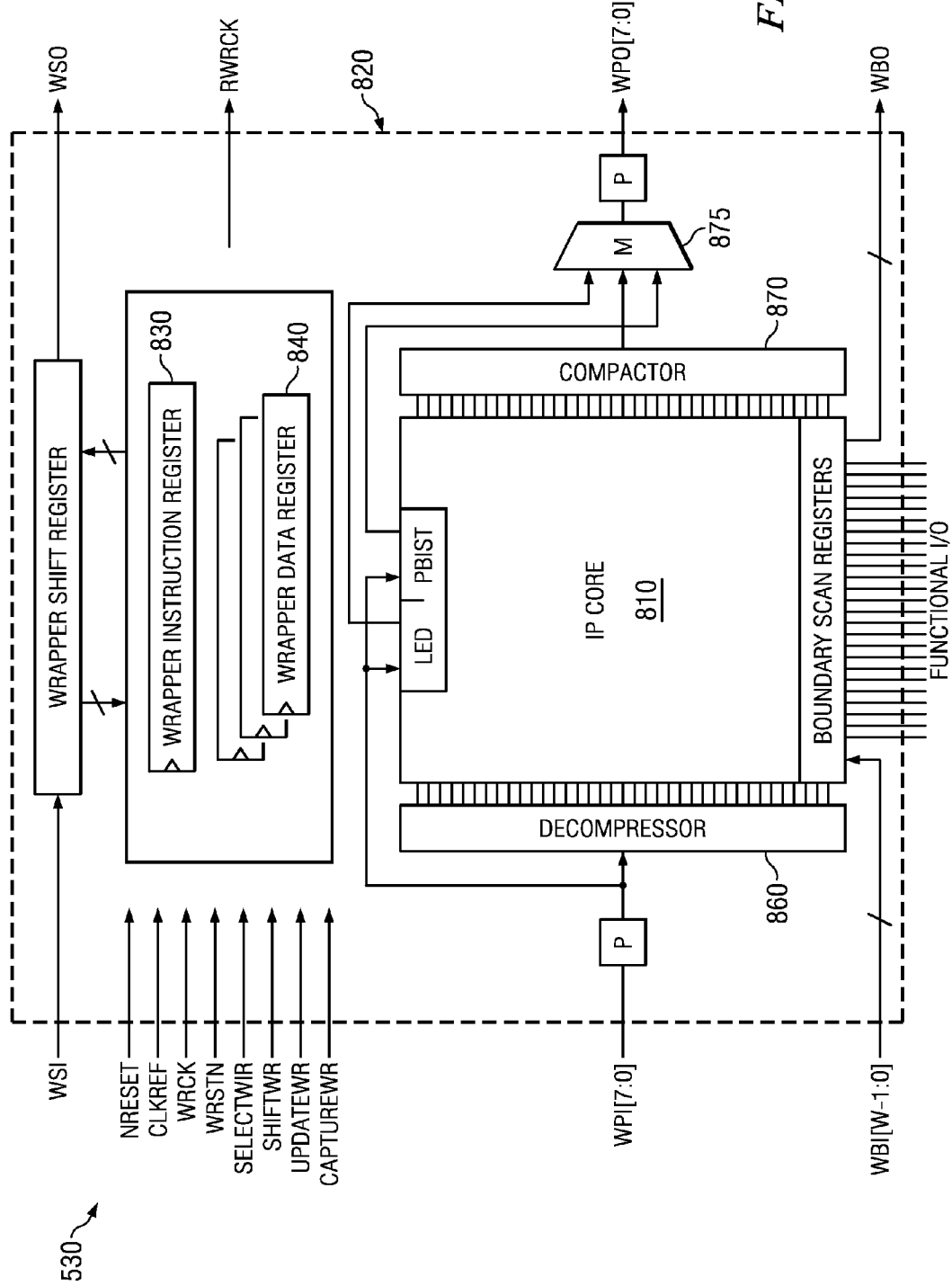
FIG. 8 is a block diagram of another inventive scan chain circuit improved as shown in the other Figures and coupled with a scan interface.

The selection control lines Partitioni_codec_select and scan-enable controls Partitioni_scanen in FIG. 1 are supplied by a master control circuit of FIG. 8 which is suitably loaded by scan procedure itself. For example, one or more of the scan data registers 840 in FIGS. 1 and 8 is suitably used to provide bits and register output lines that reach the FIG. 1 circuitry as Partitioni_codec_select and scan-enable controls Partition-i_scanen.

Control circuitry supplies the controls named Partition1, 2_scanen and Partition1,2_codec_select. JTAG or IEEE 1500 control/data registers are used to provide the test mode controls or settings (bit combinations) and they are decoded to provide specific control values to the multiplexers 170.i and mux 180 for the selection between dummy chains 160.i and actual clock scan chain 110. Shift and Capture control in individual partitions i is provided by test mode settings, which, in turn, controls the clocks to these partitions i. TABLE 2 shows scan control states for enabling and disabling various controls for particular partitions designated P1, P2 in the TABLE 2 headings. These states can be electronically established by digital bits each having a level of 0 or 1, or by encoding numerous desired states in the tester or emulator and then decoding them into individual bits or bit fields in the target integrated circuit being tested. P1, P2 refer to an example of Partitions 1 and 2 as in FIG. 1, and further partitions can be provided. Notice the regular form of TABLE 2 in which when Test Mode for a given partition, e.g. P1, is enabled with its scan control Shift or Capture enabled, then the dummy chain 160.2 for the other partition P2 is switched in (enabled) in place of the clock chain 110 which could otherwise have been used for that partition and the other partition P2 is disabled for test purposes. For example, with two partitions P1 and P2, and comparing FIG. 1 with TABLE 2:

Partition1_codec_select=TestModeP1;

Partition2_codec_select=NOT(TestModeP1).

TABLE 2

SCAN CONTROL STATES (EXAMPLE)

| Test Mode - P1 | Test Mode - P2 | Shift control - P1 | Capture control - P1 | Shift control - P2 | Capture control - P2 | Dummy chain - P1 | Dummy chain - P2 |
|---|---|---|---|---|---|---|---|
| Enabled | Disabled | Enabled | Disabled | Disabled | Disabled | Disabled | Enabled |
| Enabled | Disabled | Disabled | Enabled | Disabled | Disabled | Disabled | Enabled |
| Disabled | Enabled | Disabled | Disabled | Enabled | Disabled | Enabled | Disabled |
| Disabled | Enabled | Disabled | Disabled | Disabled | Enabled | Enabled | Disabled |

A process of operation operates the input Mux 180 from the Decompressors 120.i and the output Muxes 170.i to the Compactors 130.i so that the single clock chain 110 serves each Partition 1 or 2 exclusively at a given time and sequentially over time, or serves both Partitions 1 and 2 concurrently instead, depending on which selection control line is active—Partition1_codec select or Partition2_codec select, or both of them active concurrently.

Moreover, the FIG. 1 embodiment 100 is readily extensible to and applicable to a design module/SOC with any number of partitions and with or without scan compression CoDecs 120.i, 130.i. The same clock control register scan chain 110 is selectively included into the Partition, or each of plural Partitions concurrently, for which ATPG is currently being targeted. The master control circuit can be configured or programmed to exclusively activate any one of numerous i-th selection control lines Partition_i_codec_select, or any two (or more) configured or programmed ones of such selection control lines. Scan-enable controls Partition_i_scanen are also suitably activated either sequentially or concurrently, as desired, to scan out the STUMPs for each Partition i, as well as the clock chain 110.

In FIG. 2, a control circuit embodiment for the clock register scan chain 110 for a particular partition is shown. Clock-control chain 110 is optionally included in whichever partition i is being tested in a given Run, depending upon need for capture clocks. For purposes of FIG. 2, clock chain 110 is "in" a given Partition i when the FIG. 1 muxes 170 and 180 couple clock chain 110 between Decompressor 120.i and Compressor 130.i; and Dummy chain 160.j is "in" its given Partition j when the mux 170.j couples dummy chain 160.j with its Compressor 130.j. Examples of Runs (or Phases) are:

Run1: Exclusive shift/capture occurs in Partition2. Clock chain 110 is in P2. Dummy chain 160.1 is in P1.
Run2: Exclusive shift/capture occurs in Partition1. Clock chain 110 is in P1. Dummy chain 160.2 is in P2.
Run3: Shift/Capture occurs in both Partitions 1 and 2. Clock chain 110 is either in P1 or P2. (Run3 is repeated if capture power issues prevent simultaneous captures in P1 and P2).

One process example 1) initializes P2 and runs P1, 2) initializes P1 and runs P2, and 3) serial shift→Serial/Parallel capture in P1 and P2.

Clock-chain 110 connections for different operations called ATPG Phase 1, 2, 3 are further described and shown in FIG. 2. These operations offer low power dissipation in test mode, no need of a bypass mode, and no need of bounding scan chains. Also, other types of operations are also supported by various embodiments.

In an ATPG Phase 1, exclusive shift and capture in Partition 2 occur. The clock chain is in Partition 2 and a dummy chain 160.1 is in Partition 1. Partition 1 is initialized and clock gated. The initialization prevents or reduces X generation. Partition 2 is initialized during scan operation and does not require any capture clock.

In an ATPG Phase 2, exclusive shift and capture in Partition 1 occur. The clock chain is in Partition 1 and a dummy chain 160.2 is in Partition 2. Partition 1 is initialized during scan operation and does not require any capture clock. Partition 2 is initialized and clock gated. The initialization prevents or reduces X generation.

In an ATPG Phase 3, shift and capture occur in both partitions 1 and 2. The clock chain 110 is located and resides either in Partition 1 or in Partition 2. Partitions 1 and 2 are scanned sequentially one after the other in any order. For instance, Partition 2 in Run 3 is scanned out as indicated by "→ capture". This phase may be repeated two times in case it is desired to limit capture power to prohibit the issue of simultaneous capture clocks in both the partitions.

Partition gating control in the architecture is suitably operated, for instance, so the states of flip-flops in the unused scan partition(s) are not disturbed. Clock and reset inputs going into these unused partitions are suitably controlled during both shift and capture phases of ATPG in the enabled partition(s). A shift operation in one partition can be arranged to not disturb the scan flip-flops in other inactive partitions. Clock gating control is also applied to selectively capture into one or more partitions. Similarly, resets to inactive partition(s) are not disturbed while shifting in active partition(s).

The illustrated embodiment and other embodiments solve the problems and are applicable to any communications, control, commercial and/or industrial clock generator circuit or other clock generator circuit that has a clock control register that can be programmed on a per-pattern basis. In one example, a SOC has 54 clock domains and about 244K scan flip-flops. P1 and P2 have about 684 and 1059 scan chains respectively. A second example involves a hardware accelerator core with two (2) clock domains and 222K scan flip-flops. Both of them have two partitions and are in 45 nm process technology, application is for cellular camera phone, power for power grid is 200 mW, and eight (8) scan-ins and eight (8) scan-outs are present. In each case, stuck-at test and transition fault test (TFT) ATPG are performed using launch-off-shift or launch-off-capture user-defined capture clock procedure for a given ATPG run. These and further embodiments also are extended and coupled to, and extend the beneficial operations to, any such other control mechanisms that make the control flip-flops part of multiple partitions, e.g. DCDR (Dynamic Core Data Registers) controlling ISO (isolation) cells, DCDR controlling clock-gates, DCDRs controlling selectively test mode power controls, etc.

(a) Some embodiments include and provide control to the FIG. 3 clock shaper 300 to generate capture clocks, controlling their number, duration, and spacing.
(b) Some embodiments include and provide control to various clock gating controls in the circuits 100 and 300 for increasing the coverage or for containing test mode capture power.

Figure 7A:
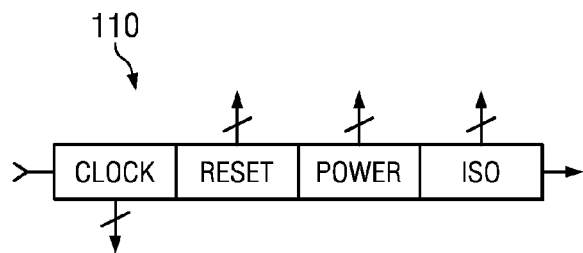
FIG. 7A is a detail of an alternative embodiment of control register 110 for FIG. 1.
Figure 7B:
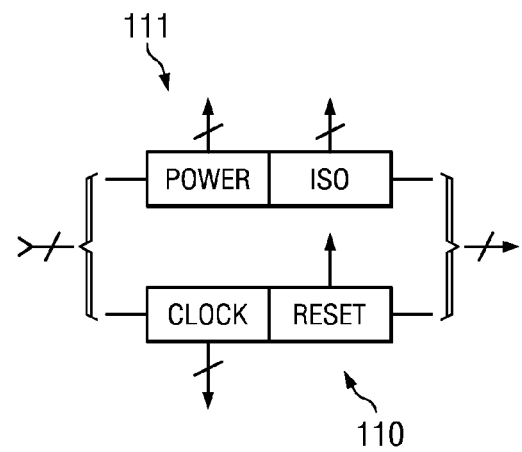
FIG. 7B is a detail of another alternative circuit for FIG. 1 adding a control register 111 with 110.
Figure 6:
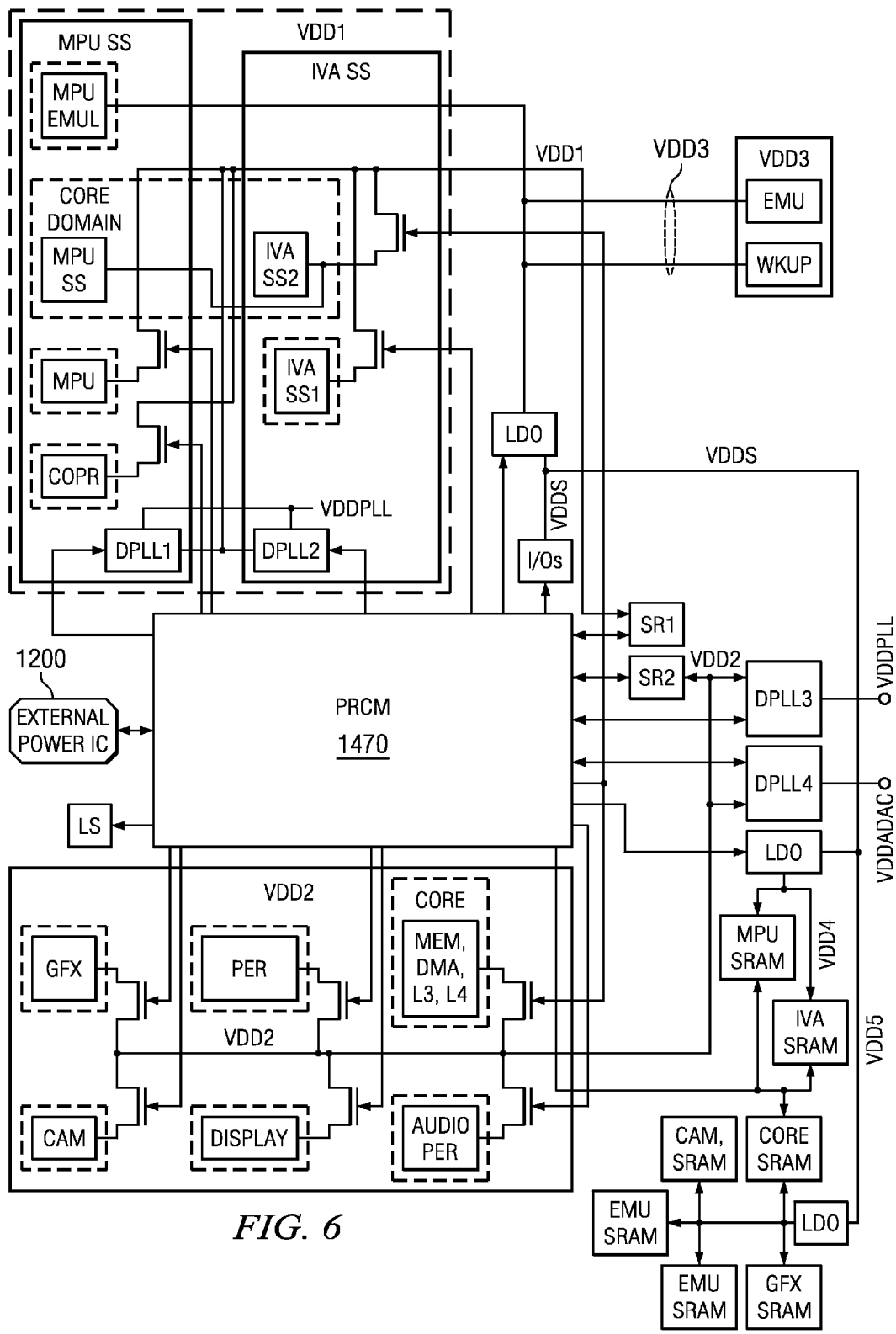
FIG. 6 is a block diagram of an embodiment for controlling power management circuits, improved according to the other Figures herein.
Figure 7:
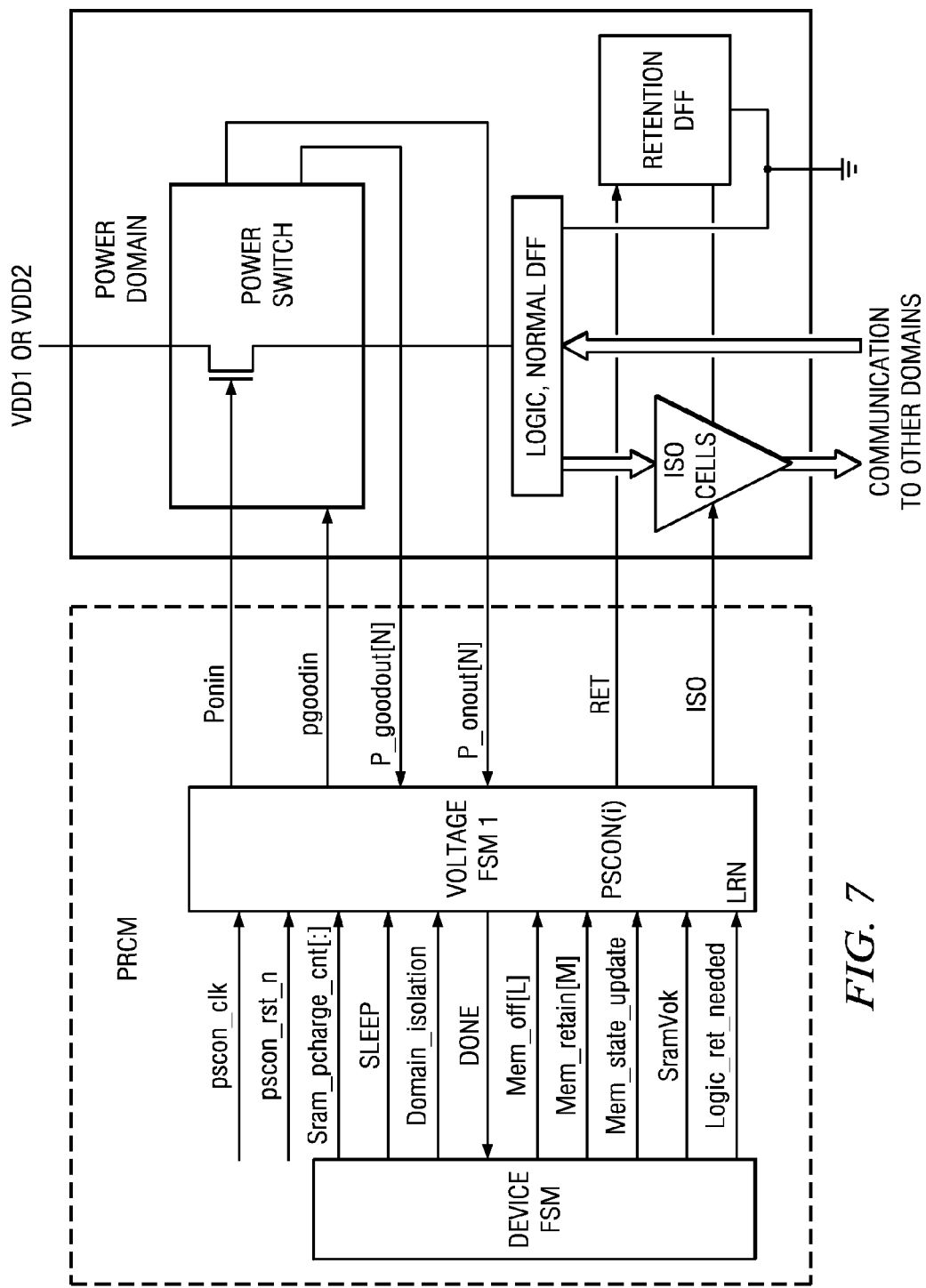
FIG. 7 is a block diagram of an embodiment for controlling isolation cells, improved according to the other Figures herein.

(c) Some embodiments use a shared programmable control circuit and a tree circuit to include and provide control as in FIG. 6, 7 and 7A or 7B to various power switches and associated isolation logic of FIGS. 6 and 7 in the circuit to control selective powering of various parts of the circuit. This can provide control for containing the test mode power in FIG. 6 as well as control for testing the isolation logic of FIG. 7.

(d) Some embodiments include and provide control as in FIG. 7A or 7B for reset logic (enabled/bypassed) in the circuit for coverage improvement.

In general, this scan chain 110 is useful to provide any form of per pattern control from the ATPG tool. The sharing of this chain 110 across different partitions P1, P2, etc. (as per various embodiments) is useful for partitioned designs or architectures for integrated circuits generally. Effectively, each flip-flop in the chain 110 is used to provide bits for programmable registers 310 that provide control to some logic for one or more of the above controls such as 322, 324, 326.

In some processes of operation, the functional clock is gated off, by Scanen disabled in the clock chain 110, for each successive scan-initialization to each of the partitions until the last partition is scan-initialized. The last scan-initialization to a partition is accompanied by scan-in to the clock chain 110 also, but this time with Scanen enabled. In some integrated circuits it may be permissible for one particular partition to always be the last one scan-initialized, and in such special case, functional clock will not be run prior to the scan-initialization of that last Partition. In that case, an embodiment eliminates muxes 170.i and 180 and situates the single clock chain 110 in fixed association with that Partition.

Some embodiments (not shown) provide clock chain 110 as a separate scan chain and separately scan it via the scannable wrapper interface 530.

Embodiments are thus not restricted to only clock control, and any partition-specific control can use them.

There are several other such possibilities where control is provided within a partition on a per ATPG pattern basis. Examples include use of (a) clock gating structures for selective clocking based on capture power requirements, (b) isolation control structures (such as in FIG. 7), wherein outputs of some isolation cells are to be selectively controlled for coverage improvements (while those of others may be forced to constant values), (c) power gating structures (such as in FIG. 6) for selective powering on/off of certain modules in the design to meet test mode power constraints, etc. Various embodiments can be applied to support all these structures, and others. For example, in some embodiments, as in FIG. 7A, the clock chain 110 is lengthened or modified to include or substitute bits for control circuitry for the reset structures, isolation control structures and/or power gating structures, with FIG. 1 illustration as shown. In some other embodiments, as in FIG. 7B, the clock chain 110 is supplemented with reset field to control reset structures, and further by a parallel control chain 111 for isolation control structures and/or power gating structures. To do this, the set of FIG. 1 structures 125.1, 125.2, 180, 160.1, 160.2, 170.1, 170.2 are replicated, for instance, to form an additional scannable control chain path (number of scan cells in chain 111 adapted for the appropriate controls) and additional dummy chain path. Still other embodiments may involve further partial replications or other modification of the disclosed embodiments.

Some of the embodiments remarkably establish re-use of clock-shaper logic 300 across different partitions. If the clock-shaper logic were replicated for different partitions or the clock shaper registers kept off-scan, logic overhead and other timing issues (often leading to lower coverage) would be imposed and result in additional ATPG runs and increased pattern count (or both).

Some of the advantages and benefits of at least some of the embodiments include:

(a) Avoiding the need to replicate the clock-shaper module for every partition, resulting in area savings.

(b) Making it easier to balance the functional clocks to all the partitions with a single clock shaper module, resulting in ease of meeting timing constraints. Also this eases clocking as there is a single clock tree.

(c) Balanced clocks are supplied to different partitions through a single clock shaper module, resulting in at-speed coverage of all logic in different clock domains, since the different partitions are now clocked synchronously.

(d) Reducing the ATPG pattern generation effort in a multi-partitioned design. Fewer ATPG runs are thus used for intra-domain logic in P1 and P2 and inter-domain logic IL (FIG. 2) coverage, better coverage is established and fewer patterns are involved, since the clock register constraints are satisfied with just one clock chain 110.

In some embodiments only a single instance of clock shaper module 300 is provided across different partitions, resulting in reduced logic overhead, ease of timing analysis, and clock tree not replicated. Such embodiments cover functionally synchronous paths at-speed. The single instance of a clock-control chain confers of ease of ATPG since only one chain is controlled using specific ATPG tool care-bits. Such embodiments improve scan compression. Programming clock-control chain through scan eliminates user provided ATPG test setup. A single ATPG run is adequate for all inter-domain logic IL and intra-domain logic e.g., in P1 and P2. Efficient ATPG with fewer patterns results since the clock-chain is programmed per-pattern.

The above benefits are realized while retaining benefits of reduced test mode power, no coverage loss, and no pattern volume increase with multi-partitioned designs. The embodiments are widely applicable to all SOCs with scan partitions, with and without scan compression, and applicable to clock shaper modules, as well as other programmable clock generators at all process nodes (e.g., down to 45 nm and smaller nodes).

It is contemplated that tool vendor support for re-using groups of scan chains across multiple partitions can facilitate deployment of some embodiments. Testing for proper operation of embodiments includes detection of a single set of patterns even when logic with multiple clock domains within is split across multiple partitions. Similar Schmoo plots for different pattern sets for multi-partitioned design imply that a same clock source is used across multiple partitions. Where available, pattern sets indicate that same clock controlling scan flip-flops are used across the sets. The design for test DFT specification can mention that only one test clock generator or only one test mode setup is used for multi-partitioned design, and different pattern sets operate off a same clock and a same clock shaper is used across multiple partitions. Lower or comparable current or power for scan patterns compared to worst case functional power also indicates multiple partitions. Multiple set of patterns for IP/SOC also indicate multiple partitions.

In FIG. 3, the programmable registers 310, designated PR1-6, are included in the scannable clock chain 110 of FIGS. 1-2. Clock gates can be controlled by scannable registers to determine which one or more partition receives the clocks.

Various embodiments based on FIGS. 1-2 are suitably formed by sharing the clock chain 310 and rest of shaper 300 of FIG. 3 between two, three, or more partitions.

Figure 4:
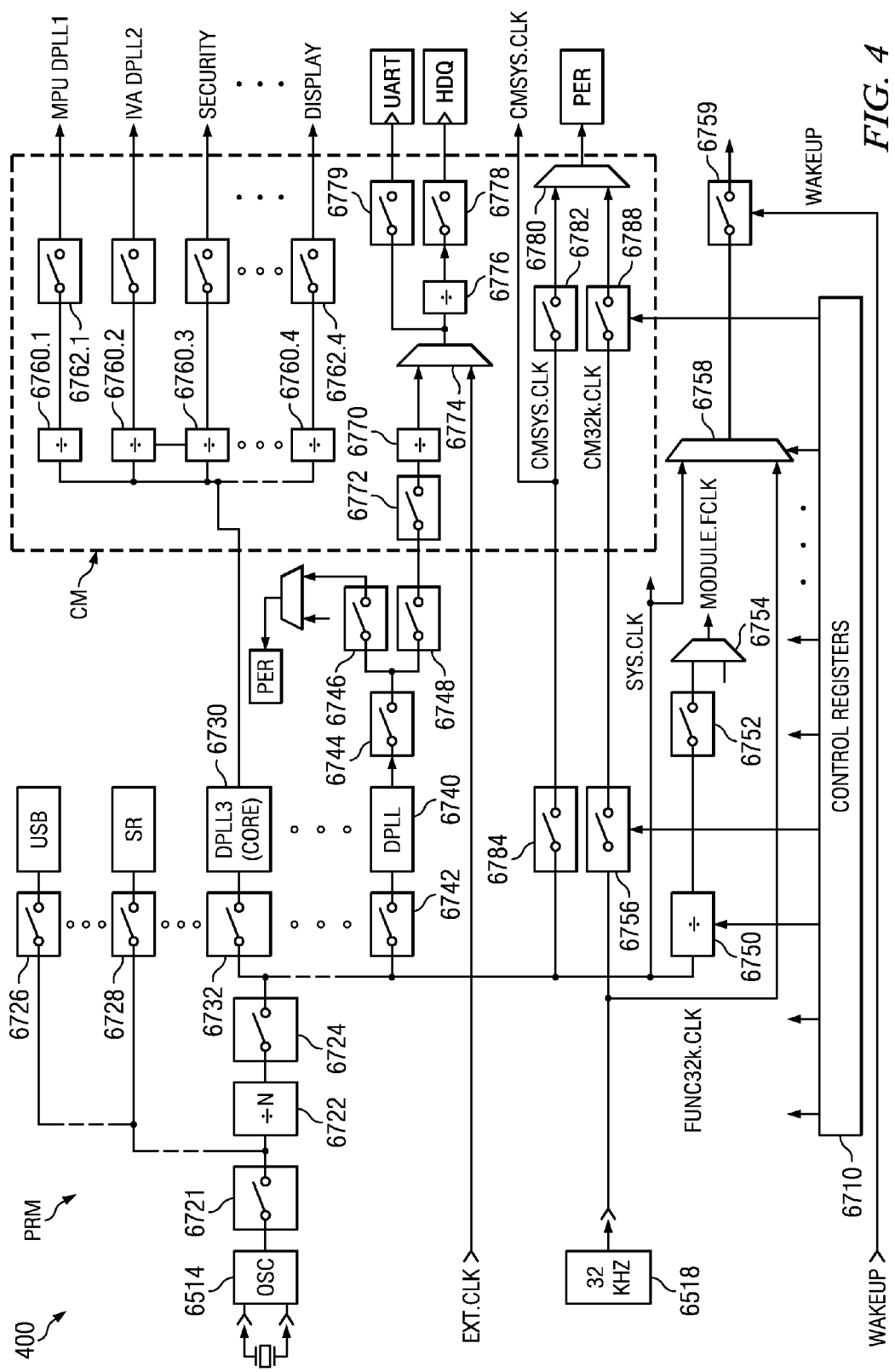
FIG. 4 is a block diagram of a clock tree augmented and controlled by the circuit of FIG. 3 for use in FIG. 1.

In FIG. 4, a clock tree and its control register are as shown in FIG. 27 of that U.S. Patent Application Publication 20080307240. Here, however, the scannable programming register 310 of FIG. 3 is substituted for, and/or augments, the control registers 6710 of that FIG. 27. The scannable programming register 310 of FIG. 3 is multiplexed for scan purposes as shown in FIGS. 1-2 herein. Moreover, the FSM 320 of FIG. 3 herein augments control for test purposes here over the clock tree(s) of that FIG. 27, and the other circuitry of FIG. 3 as described herein is combined with and/or enhances one or more of the dividers and switches of the clock tree(s) of that FIG. 27.

One or more such embodiments are suitably provided in an integrated circuit. Clock routing into the partitions can be physically distributed by tree circuitry 400 into different parts of the chip and controlled out of the clock circuitry 300 with different parts respectively controlled by particular clock chain 110 segments or portions in the shared clock chain 110 (310) in a manner suitable at any given point in the test procedure. For example also, two or more such embodiments might be provided to establish a desired length of clock routing, or simplicity or complexity of clock routing into the partitions physically distributed as they are in different parts of the chip and supplied out of the clock circuitry 300 controlled by a particular clock chain. In a large integrated circuit having many partitions and high clock rate, the use of two or more clock chains each shared by two or more partitions not only confers appealing real estate economy and ATPG efficiency compared to providing a clock chain for every partition, but also accommodates independent placement of plural clock chains in reduced number on the chip.

Various embodiments of an integrated circuit improved as described herein are manufactured according to a suitable process of manufacturing. The process prepares RTL (register transfer language) and netlist for a particular design of a scan decompressor and compactor circuit and associated circuitry for testing the functional integrated circuitry. The detailed description describes those examples and various other alternatives.

Figure 5:
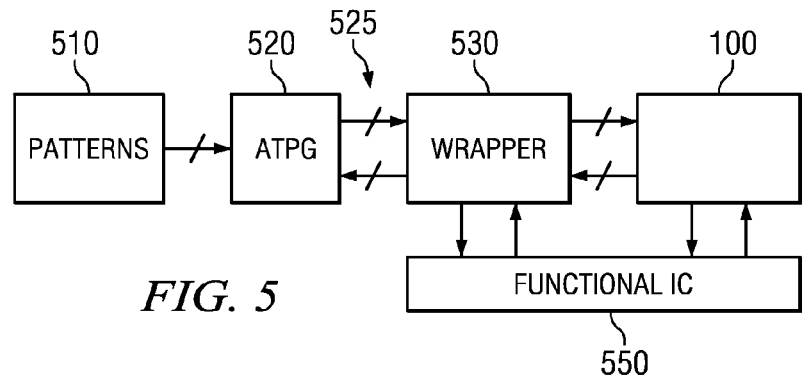
FIG. 5 is a block diagram of a testing system for ATPG.

FIG. 5, together with FIG. 1 shows an embodiment that conveniently retrofits with and dramatically simplifies a conventional system hardware while perhaps involving only modest revision of the ATPG patterns 510 for a test tool 520. The patterns 510 are compressed by test tool 520. Thus-compressed patterns 525 and other controls from the test tool 520 enter a scannable wrapper circuit 530 and go to a selected Decompressor 120.i of embodiment 100 of FIG. 1. The wrapper 530 circuit and FIG. 1 circuitry 100 are coupled to various scan chains of the integrated circuit device under test DUT 550 (810 of FIG. 8).

In FIG. 5, viewed as a process diagram, a flow for preparing or generating patterns accommodates X-content and uses the circuit of FIG. 1-4. In FIG. 5, debug pattern generation, file sources 510 of inputs for ATPG tool 520 are suitably any of 1) Spf/testproc, 2) Failing ASCII pattern, 3) Failing TDL/VVS or otherwise. A fourth file source provides a file such as a Mask-code pins file for DFTMAX, include file for TK, or modular VVS for compiled TDL. For some background, see U.S. patent application Ser. No. 12/904,303 (TI-68166) "Compressed Scan Chain Diagnosis by Internal Chain Observation Processes, Circuits, Devices and Systems" filed Oct. 14, 2010, and which is incorporated herein by reference in its entirety. The circuits of the various Figures herein are suitably combined with those of any one or more of the incorporated patent applications to enhance embodiments herein and provide further embodiments.

Figure 9:
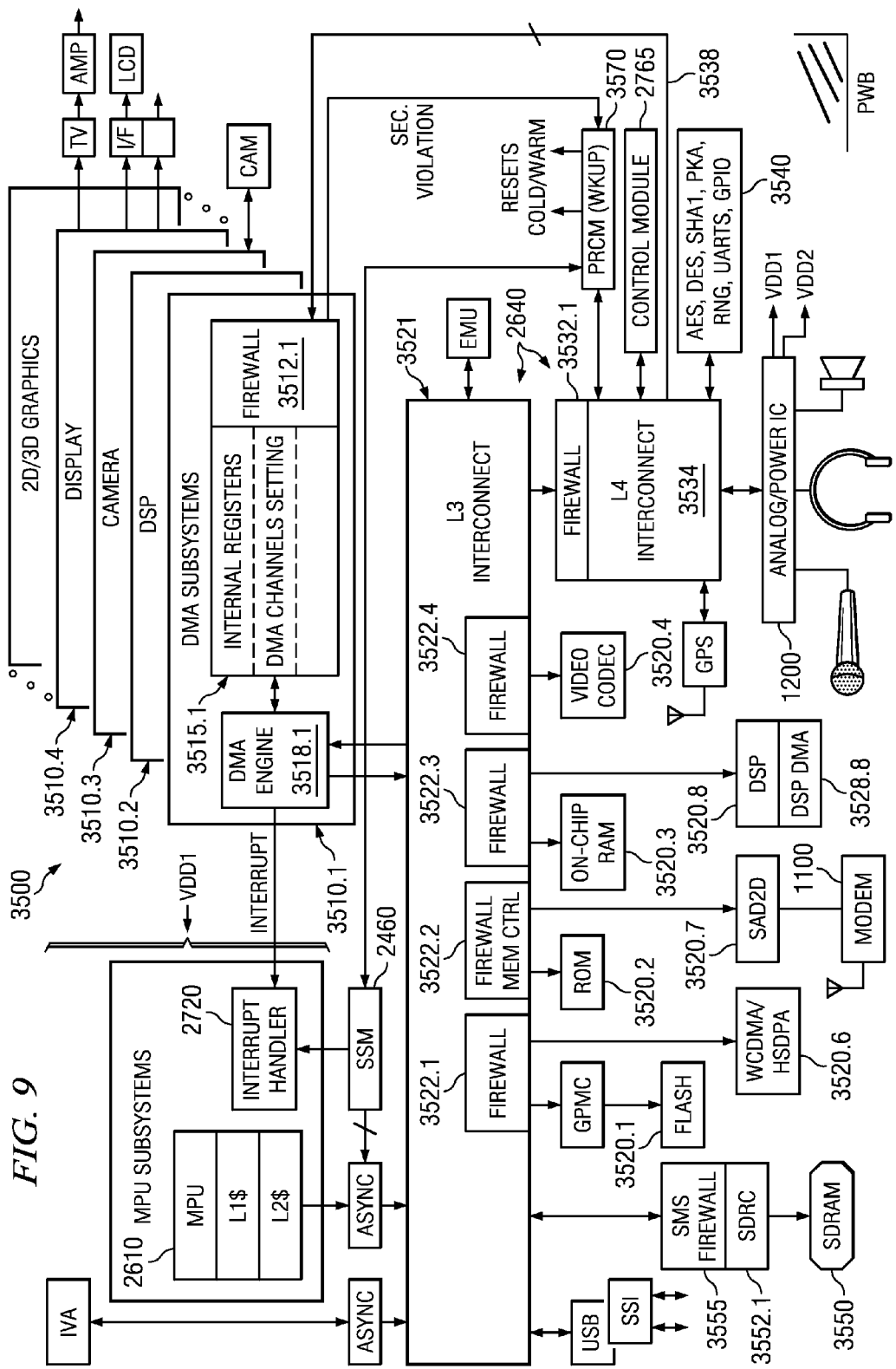
FIG. 9 is a block diagram of an inventive system for multimedia processing and telecommunications improved as shown in the other Figures.

Some examples of applications are in cellular modems, digital camera electronics, camera phones, videophones and other applications such as shown in FIG. 9.

In FIG. 6, power management and power switching of cores for partitions herein are shown also, for example, as in like-numbered FIG. 6 of U.S. Patent Application Publication 20080307240 "Power Management Electronic Circuits, Systems, and Methods and Processes of Manufacture" dated Dec. 11, 2008, and which is incorporated herein by reference in its entirety. For example, in FIG. 1, clock chain 110 is suitably lengthened as in FIG. 7A or modified to include or substitute bits for control circuitry to establish resets control and/or scan-control over the power switching structures of FIG. 6. Alternatively, in FIG. 7B, an additional scannable control chain path (number of scan cells in another control chain 111 adapted for the appropriate controls) and additional dummy chain path beyond FIG. 1 are added for controlling the power management and power switching of cores.

In FIGS. 7 and 7A or 7B, isolation circuitry for embodiments as described elsewhere herein are shown also, for example, as in FIG. 23 of U.S. Patent Application Publication 20080307240 "Power Management Electronic Circuits, Systems, and Methods and Processes of Manufacture" dated Dec. 11, 2008, and which is incorporated herein by reference in its entirety. For example, in FIG. 1, clock chain 110 is suitably lengthened as in FIG. 7A or modified to include or substitute bits for shared control circuitry to control a tree circuit to isolation circuits for isolation in a manner somewhat analogous to the way FIG. 3 clock control circuitry 300 is described to control FIG. 4 tree circuit(s) 400. Here, such shared control circuitry has FIG. 7 modified with scan-programmable enhanced shared FSM(s) and DFFs (D-flipflops) to establish scan-control over isolation circuit ISO cells and DFFs of FIG. 7 applied as multiple instances in FIG. 6. Resets control is also suitably provided. Alternatively, in FIG. 7B, an additional scannable control chain path (number of scan cells in another control chain 111 adapted for the appropriate controls) and additional dummy chain path beyond FIG. 1 are added for controlling the isolation circuits. Various other rearrangements of registers and register bits and register fields can also be established and made.

Various integrated circuits such as soft cores having the embodiments shown in FIGS. 1-7 can be easily tested. ATPG setup with vendor tool supported commands for different incremental ATPG runs help test the embodiments or detect and test their operations on different chips.

In FIG. 8, an IEEE 1500 wrapper circuit 530 is used to setup/control many of the test related features within the functional integrated circuit, or IP core, 810 (550 in FIG. 5) according to the FIG. 8 embodiment as improved in FIGS. 1-3 and 5-7. In this way, an interface couples chip-level test pins with a functional integrated circuit and provides a test wrapper to allow access to the functional integrated circuit 810. Use of a wrapper is not limiting, and some embodiments as shown in other Figures herein can lack a wrapper. The test wrapper has a Wrapper Shift Register 820 for serial entry of instructions and data via a Wrapper Shift Input WSI and can scan out resulting information at Wrapper Shift Output WSO. A Wrapper Instruction Register 830 is coupled and controlled to receive the test instructions from Wrapper Shift Register 820. A Wrapper Data Register 840 coupled and controlled to receive the test data from Wrapper Shift Register 820 or conversely to deliver resulting data to Wrapper Shift Register 820 for serial scan out at WSO. A set of control signals NRESET, CLKREF, WRCK, WRSTN, SELECTWIR, SHIFTWR, UPDATE WR, AND CAPTUREWR control these operations.

Further in FIG. 8, an 8-wide input WPI[7:0] feeds a Decompressor 860 as well as a Load Execute Dump LED interface and a programmable BIST or PBIST, interface. Decompressor 860 provides and sets up a bit-image for functional integrated circuit 810 to operate upon, and the LED and PBIST interfaces are coupled to control what operations are to occur and be tested. See FIGS. 1-3 and 5-7 for detail of circuits involving Decompressor 860 and Compactor 870. A mux 875 has three inputs respectively fed by a Compactor 870 an output from the Load Execute Dump LED interface, and an output from the PBIST interface. Mux 875 delivers an output to WPO[7:0]. Functional integrated circuit 810 also has boundary scan registers that provide Functional I/O and also have a serial input WBI[(W-1):0] and a serial output WBO.

In FIG. 9, an example of a system embodiment 3500 has a system functional integrated circuit chip improved as in the other Figures. System 3500 has an MPU microprocessor unit subsystem and an image and video acceleration IVA subsystem, and DMA (Direct Memory Access) subsystems 3510.*i*. See U.S. Patent Application Publication 20080307240 (TI-60478) "Power Management Electronic Circuits, Systems, and Methods and Processes of Manufacture," which is incorporated herein by reference in its entirety. In FIG. 9, a Modem integrated circuit (IC) 1100 supports and provides communication interfaces for any one or more of such embodiments. The system embodiment examples of FIG. 9 are also provided in a communications system and implemented as various embodiments in any one, some or all of cellular mobile telephone and data handsets, a cellular (telephony and data) base station, a WLAN AP (wireless local area network access point), a Voice over WLAN Gateway with user video/voice over packet telephone, and a video/voice enabled personal computer (PC) with another user video/voice over packet telephone, that communicate with each other. A camera CAM provides video pickup for a cell phone or other device to send over the internet to another cell phone, personal digital assistant/personal entertainment unit, gateway and/or set top box STB with television TV. Various production-testable and/or field-testable system embodiments are provided on a printed circuit board (PCB), a printed wiring board (PWB), and/or in an integrated circuit on a semiconductor substrate.

Another example of application of the test circuitry is in a target integrated circuit including a highly integrated, programmable platform for Set-top Box (STB), video transcoding and streaming media, and HD video conferencing applications. Programmable video and audio processing with a highly integrated peripheral set is supported a Texas Instruments TMS320C64xx™ VLIW (very long instruction word) DSP (digital signal processor) core, image co-processors, and a RISC CPU (reduced instruction set computing central processing unit). The RISC CPU allows control functions to be separated from audio/video algorithms programmed on the DSP and co-processors thus reducing the complexity of the system software.

Various embodiments can be used with one or more microprocessors, for example, each microprocessor having a pipeline, and selected from the group consisting of 1) reduced instruction set computing (RISC), 2) digital signal processing (DSP), 3) complex instruction set computing (CISC), 4) superscalar, 5) skewed pipelines, 6) in-order, 7) out-of-order, 8) very long instruction word (VLIW), 9) single instruction multiple data (SIMD), 10) multiple instruction multiple data (MIMD), 11) multiple-core using any one or more of the foregoing, and 12) microcontroller pipelines, control peripherals, and other micro-control blocks using any one or more of the foregoing.

As noted, the embodiments in this disclosure are applicable, among other things, to all classes of digital and mixed signal (digital/analog) circuits to which the advantages and benefits commend their use and to all types of systems using such circuits. The FIG. 9 system context and other description hereinabove are by way of example and not of limitation.

Figure 10:
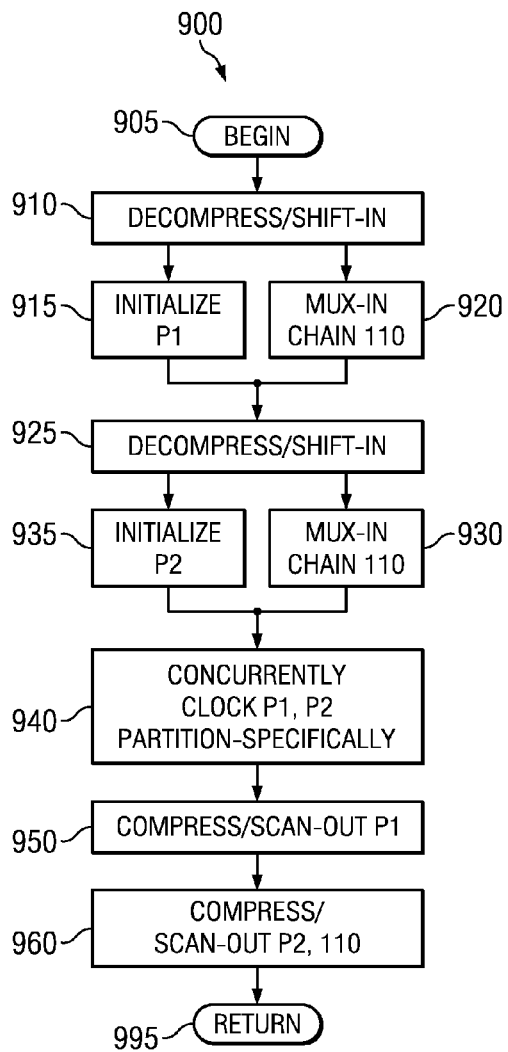
FIG. 10 is a flow diagram of an inventive process for operating or testing the circuits of the other Figures.

In FIG. 10, an automated test pattern generation process 900 is applied to an integrated circuit having multiple partitions like P1 and P2 of FIGS. 1-2 and scan chains therein to partition-specifically initialize the partitions via scan-in of the scan chains therein. The tester 520 provides a compressed test input at BEGIN 905. In a step 910, circuit 100 decompresses the test input and step 915 shifts in decompressed bits for partition-specifically initializing partition P1, and later steps 925 and 935 similarly initialize partition P2. Decompression 910 also supports the routing in of the clock circuitry 310 programming bits by a step 920 concurrently with step 915, and similarly by a step 930 concurrent with step 935. For instance, the tester can provide at least two sets of test inputs or patterns in succession that each include both partition-specific initialization and clock control information compressed together. In FIG. 10, the process decompresses at least two sets of test inputs set-wise successively. The first set provides both partition-specific initialization to the scan chain for a partition P1 and a first set of clock control bits for the clock shaper circuit 300 and clock tree 400. The second set provides partition-specific initialization to the scan chain for a partition P2 and a different set of clock control bits for the clock shaper circuit 300 and clock tree 400. Each time the decompressed bits for programming the clock circuitry go to the same shared circuitry 310 regardless of which test input or pattern. The decompressing suitably decompresses test patterns in different decompressor circuits depending on the partition targeted, and the scanning-in includes multiplexing from the decompressor circuits into the single shared circuit such part of the decompressed test patterns intended for the single shared circuit from whichever decompressor circuit is currently active.

Here, upon routing in clock circuitry programming bits for the circuit 300 and clock tree 400, with the clock tree coupled at various places thereof to partitions P1 and P2, the decompressed test input is successively coupled with a FIG. 3 scan interface 310 for the FIG. 4 clock tree 400. For some tests, the process confers the flexibility to apply functional clock, in cases where that may be useful, via the clock tree 400 responsive to the first set of clock control bits prior to receiving and decompressing the second of the at least two test inputs. Subsequently, in a step 940, clock is applied via the same clock tree responsive to the second set of clock control bits after decompressing the second set of test inputs so that both partitions P1 and P2 are partition-specifically clocked concurrently in response to the clock tree, i.e. in response to the programming bits controlling the clock tree as aforesaid. The partition-specific clocking readily includes clocking at least one of those partitions at a first clock frequency and clocking at least another of those partitions at a second clock frequency, and both the first and second clock frequency can emanate from the same clock tree 400 such as in FIG. 4. In complex integrated circuit chips with many partitions, more complicated test procedures may partition-specifically clock only some of the partitions concurrently out all the partitions in the chip.

Next, a capture process 950, 960 scans out at least some scan chains in at least one of the partitions, e.g. P1. In FIG. 10 for instance, the scanning out scans out the scan chains in at least two of the partitions sequentially, one partition after the other. In other processes and chip hardware, the scan-out can suitably scan out the scan chains in at least two of the partitions in parallel where scan-out power considerations may be less applicable. Operations reach RETURN 995, such as to go to another test run.

One process example 1) initializes P2 and runs P1, 2) initializes P1 and runs P2, and 3) serial shift→Serial/Parallel capture in P1 and P2.

Figure 11:
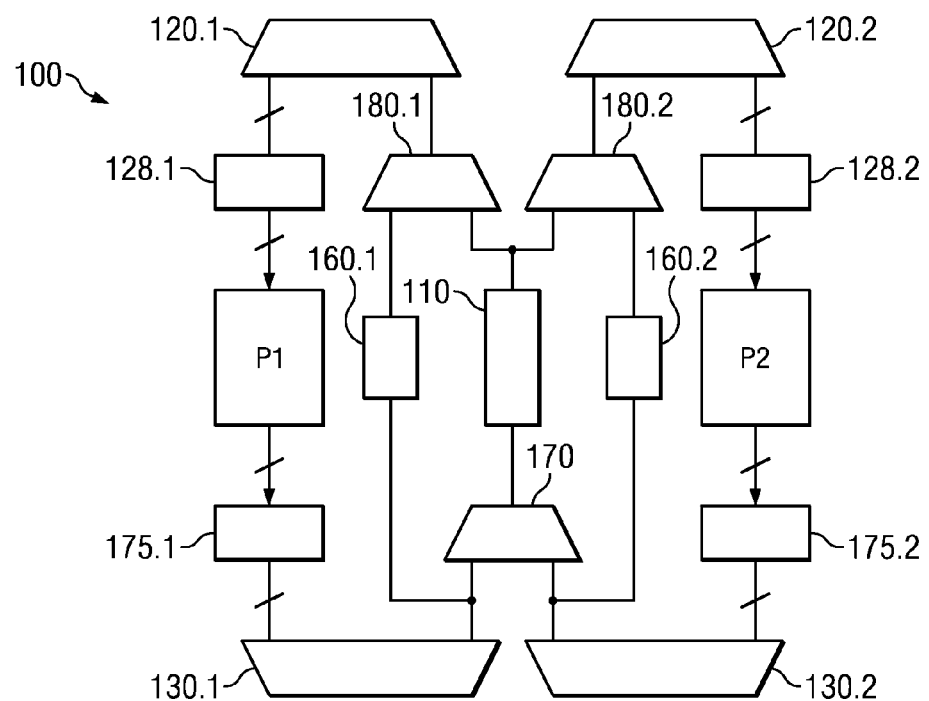
FIG. 11 is a block diagram of another inventive scan chain circuit coupled with a scan interface.
Figure 12:
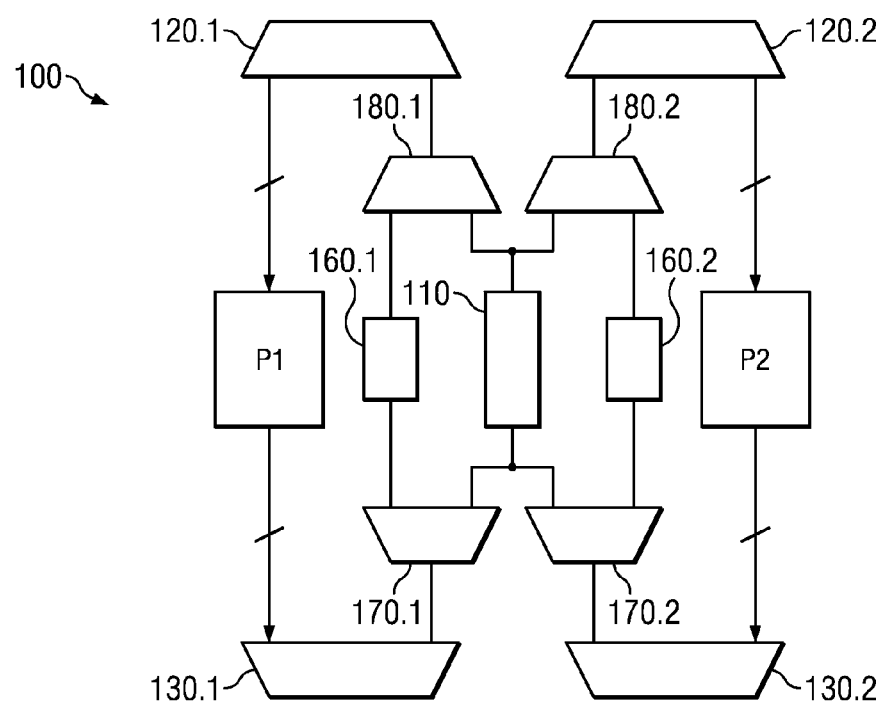
FIG. 12 is a block diagram of a further inventive scan chain circuit coupled with a scan interface.

In FIGS. 1, 11 and 12, some embodiments provide decompressor 120.i that feeds scan chains for multiple partitions successively via either or both of an output mask 175.i and input mask 128.i. Scannable control chain 110 (or 300, 310) on each such successive scan for a partition P1, P2, etc. receives respective sets of clock programming bits for registers 310 of FIG. 3. Clock tree 400 or other control tree fans out across both P1 and P2, etc., for simultaneously operating them if called for on any given phase or pattern of tester 520 operation. These embodiments are especially appealing in a combined embodiment that operates a circuit that has a mask, but now with dramatically simplified clock control hardware. Clock chain 110 may be modified or substituted with resets control, power management and/or isolation control as in FIG. 7A. Alternatively, as in FIG. 7B, clock chain 110 is augmented with a scannable parallel control chain 111 for the power management and/or isolation control.

In FIG. 11, the scannable integrated circuit has multiple scan compactors 130.i corresponding to multiple scan decompressors 120.i. Plural demuxes 180.1, 180.2 etc selectively couple with the shared scan-programmable control circuit 300 including scannable registers 310 for scan programming through any of the decompressors 120.i. A single demux 170 selectively couples control circuit 300 registers 310 for compression with Partitioni scan chains and scan output through a selected one of the compactors 130.i corresponding to the currently-selected decompressor 120.i selected by jointly connected first outputs of demuxes 180.1, 180.2 etc. Each of dummy chains 160.i is coupled respectively to and fed from a second output of demux 180.1, 180.2 etc. Also, each of dummy chains 160.i is connected to a respective one of the outputs of demux 170 that goes to the corresponding compactor 130.i. In this way, one or both of demux circuits 180.i and 170 are arranged and operable to provide a scan path via each dummy chain 160.i between its decompressor 120.i and the corresponding scan compactor 130.i unless the shared scan-programmable control circuit 300 with register 310 is currently-selected to provide such scan path therebetween.

In FIG. 12, the scannable integrated circuit also has multiple scan compactors 130.i corresponding to multiple scan decompressors 120.i. Plural demuxes 180.1, 180.2 etc selectively couple with the shared scan-programmable control circuit 300 including scannable registers 310 for scan programming through any of the decompressors 120.i. Unlike FIG. 11, corresponding plural counterpart muxes 170.1, 170.2 etc selectively couple control circuit 300 registers 310 for compression with Partitioni scan chains and scan output through a selected one of the compactors 130.i corresponding to the currently-selected decompressor 120.i selected by jointly connected first outputs of demuxes 180.1, 180.2 etc. To provide the selective coupling, the register 310 is jointly connected to each first input of plural muxes 170.1, 170.2 etc. Each of dummy chains 160.i is coupled respectively to, and fed by, a second output of demux 180.1, 180.2 etc. Also, each of dummy chains 160.i is coupled respectively to its second input of mux 170.1, 170.2 etc. Each mux 170.i has an output that goes to the corresponding compactor 130.i. In this alternative way, one or both of demux circuits 180.i and mux circuits 170.i are arranged and operable to provide a scan path via each dummy chain 160.i between its decompressor 120.i and the corresponding scan compactor 130.i unless the shared scan-programmable control circuit 300 with register 310 is currently-selected to provide such scan path therebetween.

Notice that FIG. 1 represents an all-mux (180, 170.i) embodiment as to support for the shared chain 110 and dummy chains 160.i. FIG. 11 represents an all-demux (180.i, 170) embodiment, and FIG. 12 represents a half-and-half demux/mux (180.i, 170.i) embodiment. When more than two partitions P1, P2, P3 or more are included and supported, the foregoing proportions of muxes and/or demuxes, as well as still further mixed proportions, in embodiments are possible. Embodiments can combine any two or more of the different circuits of FIGS. 1, 11 and 12 by making scan chain 110 (310) be shared by those different circuits and jointly connected to them. The muxes and demuxes shown in the Figures can be implemented in a variety of suitable ways, such as AND/OR/ NOT logic, transmission gate logic, dynamic logic, and otherwise.

Figure 13:
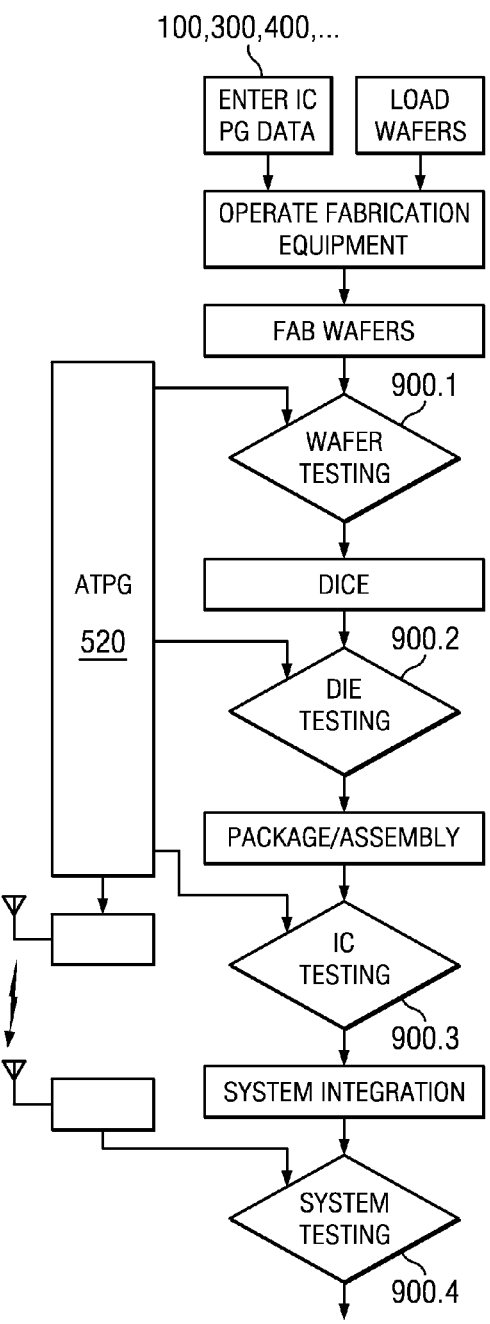
FIG. 13 is a flow diagram of an inventive process of manufacturing the inventive circuits of the other Figures.

In FIG. 13, various embodiments as described herein are manufactured in a process that prepares RTL (register transfer language or hardware design language HDL) and netlist for a particular design including circuits of the Figures herein in one or more integrated circuits or a system. The design of the scan decompression and compaction circuitry and other hardware is verified in simulation electronically on the RTL and netlist. Verification checks contents and timing of registers, operation of hardware circuits under various configurations, proper responses to commands and instructions, real-time and non-real-time operations and interrupts, responsiveness to transitions through modes, sleep/wakeup, and various attack scenarios. When satisfactory, the verified design dataset and pattern generation dataset representing the integrated circuits of the various Figures herein go to fabrication equipment in a wafer fab operated to fabricate the integrated circuit die and packaging/assembly produces a resulting packaged integrated circuit and tests it. Testing 900 of FIG. 10 is suitably applied at any one, some or all of wafer test 900.1, die test 900.2, or packaged IC test 900.3, using ATPG test equipment 520 of FIG. 5. Testing thus verifies operations directly on first-silicon and production wafer samples or die samples such as by using the scan chain methodology on registers and other circuitry until satisfactory chips are obtained. A particular design and printed wiring board (PWB) of the system unit, has an applications processor coupled to a modem, together with one or more peripherals coupled to the processor and a user interface coupled to the processor. A storage, such as SDRAM and Flash memory is coupled to the system and has configuration and parameters and a real-time operating system RTOS, processor software, public HLOS, protected applications (PPAs and PAs), and other supervisory software. System testing in either or both of production and remote field-testing can include testing 900.4 and suitably also tests operations of the integrated circuit(s) and system in actual application for efficiency and satisfactory operation of fixed or mobile video display for continuity of content, phone, e-mails/data service, web browsing, voice over packet, content player for continuity of content, camera/imaging, audio/ video synchronization, and other such operation that is apparent to the human user and can be evaluated by system use. Also, various attack scenarios are applied. If further increased efficiency is called for, parameter(s) are reconfigured for further testing. Adjusted parameter(s) are loaded into the Flash memory or otherwise, components are assembled on PWB to produce resulting system units.

The compressed scan chain diagnostic circuitry is useful in other types of integrated circuits such as ASICs (application specific integrated circuits) and gate arrays and to all circuits with structures and analogous problems to which the advantages of the improvements described herein commend their use.

In addition to inventive structures, devices, apparatus and systems, processes are represented and described using any and all of the block diagrams, logic diagrams, and flow diagrams herein. Block diagram blocks are used to represent both structures as understood by those of ordinary skill in the art as well as process steps and portions of process flows. Similarly, logic elements in the diagrams represent both electronic structures and process steps and portions of process flows. Flow diagram symbols herein represent process steps and portions of process flows in software and hardware embodiments as well as portions of structure in various embodiments of the invention.

Processing circuitry comprehends digital, analog and mixed signal (digital/analog) integrated circuits, ASIC circuits, PALs, PLAs, decoders, memories, and programmable and nonprogrammable processors, microcontrollers and other circuitry. Internal and external couplings and connections can be ohmic, capacitive, inductive, photonic, and direct or indirect via intervening circuits or otherwise as desirable. Process diagrams herein are representative of flow diagrams for operations of any embodiments whether of hardware, software, or firmware, and processes of manufacture thereof. Flow diagrams and block diagrams are each interpretable as representing structure and/or process. While this invention has been described with reference to illustrative embodiments, this description is not to be construed in a limiting sense. Various modifications and combinations of the illustrative embodiments, as well as other embodiments of the invention may be made. The terms including, includes, having, has, with, or variants thereof are used in the detailed description and/or the claims to denote non-exhaustive inclusion in a manner similar to the term comprising. The appended claims and their equivalents cover any such embodiments, modifications, and embodiments as fall within the scope of the invention.

What is claimed is:

1. A scannable integrated circuit comprising:
a functional integrated circuit having scan chains;
multiple scan decompressors, each operable to supply scan bits to some of the scan chains;
a shared scan-programmable control circuit;
a tree circuit coupled with the functional integrated circuit, the shared scan-programmable control circuit coupled to control the tree circuit; and
a selective coupling circuit operable to provide selective coupling with said shared scan-programmable control circuit for scan programming through any of said multiple scan decompressors.

2. The scannable integrated circuit claimed in claim 1 wherein said selective coupling circuit is operable on a per pattern basis.

3. The scannable integrated circuit claimed in claim 1 wherein said multiple scan decompressors are operable on a per-pattern basis to decompress test patterns for a selected set of scan chains for each such pattern.

4. The scannable integrated circuit claimed in claim 1 operable in test runs and wherein said functional integrated circuit has multiple clock domains, and said tree circuit couples with at least two of said multiple clock domains for a single test run.

5. The scannable integrated circuit claimed in claim 1 wherein said functional integrated circuit has multiple clock domains and has both inter-clock domain logic and intra-clock domain logic coupled with said tree circuit.

6. The scannable integrated circuit claimed in claim 1 further comprising multiple scan compactors and a second selective coupling circuit operable to provide coupling of said shared scan-programmable control circuit for compaction and scan output through any selected one of said multiple scan compactors.

7. The scannable integrated circuit claimed in claim 6 further comprising at least one dummy chain wherein said second selective coupling circuit is operable to selectively couple at least one said dummy chain to a said scan compactor unless said shared scan-programmable control circuit is coupled to that scan compactor.

8. The scannable integrated circuit claimed in claim 6 further comprising at least one dummy chain coupled with at least one of said scan compactors.

9. The scannable integrated circuit claimed in claim 1 further comprising at least one dummy chain coupled with at least one of said scan decompressors.

10. The scannable integrated circuit claimed in claim 1 further comprising multiple scan compactors corresponding to said multiple scan decompressors, and a second selective coupling circuit operable to provide coupling of said shared scan-programmable control circuit for compression and scan output through a selected one of said multiple scan compactors corresponding to the currently-selected one of said multiple scan decompressors selected by said first-named selective coupling circuit.

11. The scannable integrated circuit claimed in claim 10 further comprising at least one dummy chain coupled to both said first-named selective coupling circuit and to said second selective coupling circuit wherein at least one of said first-named and second coupling circuits are arranged and operable to provide a scan path via the at least one said dummy chain between a said decompressor and the corresponding said scan compactor unless said shared scan-programmable control circuit is currently-selected to provide such scan path therebetween.

12. The scannable integrated circuit claimed in claim 1 wherein said functional integrated circuit has plural partitions each having some of the scan chains associated with the decompressors respectively, and wherein said functional integrated circuit has multiple clock domains associated among said partitions, said tree circuit extending to at least two of said multiple clock domains.

13. The scannable integrated circuit claimed in claim 1 wherein at least one of said multiple scan decompressors is operable to concurrently feed programming to the shared control circuit along with the scan bits to said some of the scan chains.

14. The scannable integrated circuit claimed in claim 1 wherein said functional integrated circuit has plural partitions each having some of the scan chains associated with said decompressors respectively, and said multiple scan decompressors are operable to partition-specifically scan-initialize the partitions one-by-one in phases in response to respective input test patterns.

15. The scannable integrated circuit claimed in claim 14 wherein said multiple scan decompressors are operable to decompress respective input test patterns into respective programming for the shared control circuit from pattern to pattern concurrently as the scan-initialize operations occur for the partitions one-by-one.

16. The scannable integrated circuit claimed in claim 15 wherein said shared scan-programmable control circuit and said tree circuit are thereby programmable to variously operate or not operate across multiple partitions after one or more of the partition-specific initialization phases, whereby providing test flexibility and test coverage.

17. The scannable integrated circuit claimed in claim 1 wherein said functional integrated circuit is operable in response to said shared scan-programmable control circuit and said scan chains are operable for scan out.

18. The scannable integrated circuit claimed in claim 1 having multiple partitions and operable to apply partition-specific control by the shared scan-programmable control circuit and tree circuit across said multiple partitions.

19. The scannable integrated circuit claimed in claim 1 having multiple partitions each having a dummy chain that is switchable into such partition when coupling to said shared scan-programmable control circuit is switched from that partition to another partition, and said dummy chain switchable out of the partition when said shared scan-programmable control circuit is switched into the partition.

20. The scannable integrated circuit claimed in claim 1 wherein said functional integrated circuit has isolation control structures and said shared scan-programmable control circuit is operable to control at least some of said isolation control structures.

21. The scannable integrated circuit claimed in claim 1 wherein said shared scan-programmable control circuit is operable to control power gating structures for selective powering on/off of parts of the integrated circuit.

22. A process for utilizing a plurality of test patterns in an integrated circuit having multiple partitions and scan chains therein, the process comprising:
    decompressing such test patterns to provide decompressed test patterns;
    partition-specifically supplying bits to a plurality of the partitions via scan-in of the scan chains therein using parts of the decompressed test patterns; and
    routing in at least another part of the decompressed test patterns as programming bits to a shared control circuit, regardless of which test pattern in the plurality, to control a tree circuit that is coupled to the plurality of the partitions.

23. The process claimed in claim 22 wherein the decompressing decompresses different ones of the test patterns in different decompressor circuits depending on the partition targeted, and the routing-in includes multiplexing said another part of the decompressed test patterns to the single shared control circuit from whichever decompressor circuit is currently active.

24. The process claimed in claim 22 further comprising applying a sequence of different test patterns wherein each such test pattern respectively initiates both an instance of the partition-specific supplying of bits to a respective one of the partitions as well as a respective instance of the routing in of programming bits to the shared control circuit.

25. The process claimed in claim 22 wherein the decompressing decompresses such a test pattern to target a currently-selected partition, and the routing-in includes selectively switching at least one scan chain for the shared control circuit into the currently-selected partition to receive the programming bits for the shared control circuit.

26. The process claimed in claim 25 further comprising switching a dummy chain into a partition unless a scan chain for the shared control circuit is switched into the partition.

27. The process claimed in claim 22 further comprising operating the shared control circuit to apply a time-sequenced set of controls to the tree circuit, the time-sequenced set of controls issuing over time in response to given programming bits.

28. The process claimed in claim 22 further comprising partition-specifically functional-clocking one or more of the plurality of the partitions via the tree circuit in response to at least some of the programming bits.

29. The process claimed in claim 28 wherein the decompressing decompresses some test patterns one-by-one, and the partition-specific functional-clocking includes selectively applying or not applying the functional clocking partition-specifically in response to a current set of such control circuit programming bits on a per-pattern basis, test pattern by test pattern.

30. The process claimed in claim 28 wherein the decompressing decompresses test patterns one-by-one, and the partition-specific functional-clocking includes selectively applying the functional clocking partition-specifically with respective frequencies in response to a current set of such control circuit programming bits on a per-pattern basis.

31. The process claimed in claim 28 wherein the partition-specifically functional-clocking includes functional-clocking at least one of those partitions at a first clock frequency and functional-clocking at least another of those partitions at a second clock frequency, both said first and second clock frequency emanating from the tree circuit.

32. The process claimed in claim 22 further comprising providing at least two test patterns in succession that each include both partition-specific bits and the programming bits compressed together.

33. The process claimed in claim 22 further comprising applying functional clock via the tree circuit responsive to a first set of programming bits prior to decompressing the second of the at least two test patterns.

34. The process claimed in claim 22 further comprising decompressing the at least two test patterns successively to provide partition-specific bits to the scan chain for a first such partition and a first set of programming bits for the shared control circuit and then to provide partition-specific bits to the scan chain for a second such partition and a second set of programming bits for the shared control circuit.

35. The process claimed in claim 34 further comprising applying functional clock via the tree circuit responsive to the second set of programming bits after decompressing the second of the at least two test patterns so that first and second such partitions are partition-specifically functional-clocked by the tree circuit.

36. The process claimed in claim 22 further comprising partition-specifically applying resets in response to the at least some of programming bits.

37. The process claimed in claim 22 further comprising partition-specifically applying power controls in response to the at least some of programming bits.

38. The process claimed in claim 22 further comprising partition-specifically applying isolation controls in response to the at least some of programming bits.

39. The process claimed in claim 22 wherein said another part of the decompressed test patterns includes other control bits selected from the group consisting of: 2) control, 2) reset control, 3) power management control, 4) isolation control.

40. The process claimed in claim 22 further comprising subsequently scanning out at least some scan chains in at least one of the partitions.

41. The process claimed in claim 40 wherein the scanning out scans out the scan chains in at least two of the partitions sequentially, one partition after the other.

42. The process claimed in claim 22 further comprising compacting the scan chains from partitions with multiple scan compactors and selectively coupling the shared control circuit for scan output through any selected one of said multiple scan compactors.

43. The process claimed in claim 42 further comprising selectively coupling at least one dummy chain for a given partition to a scan compactor unless said shared control circuit is currently coupled to that said scan compactor.

44. The process claimed in claim 43 wherein the decompressing uses decompressor circuits for different partitions and the process further comprising selectively coupling the shared control circuit for scan input through any selected one of said decompressor circuits and coupling such dummy chain to a decompressor unless the shared control circuit is coupled to that decompressor.

45. A process of manufacturing an integrated circuit comprising using fabrication equipment to make an integrated circuit having functional circuitry with scan chains, multiple scan decompressors each operable to supply scan bits to some of the scan chains, a shared scan-programmable control circuit, a tree circuit coupled with the functional circuitry, the control circuit coupled to control the tree circuit, and a selective coupling circuit operable to provide coupling of said shared scan-programmable control circuit for scan programming through any selected one of said multiple scan decompressors.

46. A telecommunications device comprising:
a printed circuit board;
a first integrated circuit having functional circuitry with scan chains, multiple scan decompressors each operable to supply scan bits to some of the scan chains, a shared scan-programmable control circuit, a tree circuit coupled with the functional circuitry, the control circuit coupled to control the tree circuit, and a selective coupling circuit operable to provide coupling of said shared scan-programmable control circuit for scan programming through any selected one of said multiple scan decompressors; and
a modem integrated circuit electrically coupled with said first integrated circuit and to said printed circuit board.

* * * * *